US006596455B2

(12) United States Patent
Yanaka et al.

(10) Patent No.: US 6,596,455 B2
(45) Date of Patent: Jul. 22, 2003

(54) LITHOGRAPHIC PRINTING PLATE PRECURSOR

(75) Inventors: Hiromitsu Yanaka, Shizuoka (JP); Kazuo Maemoto, Shizuoka (JP)

(73) Assignee: Fuji Photo Film Co., Ltd., Minami Ashigara (JP)

(*) Notice: Subject to any disclaimer, the term of this patent is extended or adjusted under 35 U.S.C. 154(b) by 146 days.

(21) Appl. No.: 09/837,163

(22) Filed: Apr. 19, 2001

(65) Prior Publication Data

US 2001/0046638 A1 Nov. 29, 2001

(30) Foreign Application Priority Data

Apr. 20, 2000 (JP) ....................................... 2000-119561
Apr. 20, 2000 (JP) ....................................... 2000-119778

(51) Int. Cl.[7] ................................................ G03F 7/038
(52) U.S. Cl. .................... 430/138; 430/270.1; 430/302; 101/453
(58) Field of Search .............................. 430/138, 270.1, 430/281.1, 286.1, 287.1, 288.1, 302, 306, 307; 101/453–467

(56) References Cited

U.S. PATENT DOCUMENTS

| | | | | | |
|---|---|---|---|---|---|
| 4,879,201 | A | | 11/1989 | Hasegawa | |
| 5,368,973 | A | * | 11/1994 | Hasegawa | 430/138 |
| 5,569,573 | A | | 10/1996 | Takahashi et al. | |
| 6,030,750 | A | | 2/2000 | Vermeersch et al. | |
| 6,399,270 | B1 | * | 6/2002 | Mori et al. | 430/270.1 |
| 2001/0018159 | A1 | * | 8/2001 | Maemoto | 430/138 |
| 2002/0031715 | A1 | * | 3/2002 | Maemoto et al. | 430/138 |
| 2002/0102488 | A1 | * | 8/2002 | Yanaka et al. | 430/138 |

FOREIGN PATENT DOCUMENTS

| | | | |
|---|---|---|---|
| EP | 0 267 037 | A2 | 11/1986 |
| EP | 0599510 | A2 | 6/1994 |
| EP | 0 916 513 | A2 | 5/1999 |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A lithographic printing plate precursor having a heat-sensitive layer on a water-receptive substrate, wherein the heat-sensitive layer comprises microcapsules containing a compound having a thermally reactive functional group, and the heat-sensitive layer or a layer adjacent to the heat-sensitive layer contains a compound capable of acting as a co-reactant in thermal reaction of the compound having a thermally reactive functional group in a state contained in other microcapsules.

11 Claims, No Drawings

LITHOGRAPHIC PRINTING PLATE PRECURSOR

FIELD OF THE INVENTION

The present invention relates to a negative-working lithographic printing plate precursor comprising a substrate having a water-receptive surface and a water-receptive image-forming layer. More specifically, the present invention is concerned with a lithographic printing plate precursor which can be subjected to platemaking by scanning exposure based on digital signals, has high sensitivity, and ensures high printing durability and scumming resistance in the printed matters.

BACKGROUND OF THE INVENTION

In general, a lithographic printing plate comprises an oleophilic image area capable of accepting ink in the process of printing and a hydrophilic non-image area capable of accepting a fountain solution. As a precursor for such a lithographic printing plate, the so-called PS plate having an oleophilic photosensitive resin layer (an ink-receptive layer) on a hydrophilic substrate has so far been used prevailingly. From such a PS plate, the intended printing plate has been generally made by subjecting the PS plate to mask exposure via a lith film and then processing the exposed PS plate with a developer to dissolve and remove the non-image area.

On the other hand, recent years have seen a proliferation of digitization technology for electronically processing, storing and outputting image information by the use of a computer And a variety of new image output systems ready for such digitization technology have come to be in practical use. Under these circumstances, it has been longed to develop computer-to-plate (CTP) technology for making a printing plate directly without the mediation of a lith film by scanning highly directional active radiation, such as laser beams, in response to digitized image information, and so it is an important technological problem to design printing plate precursors appropriate for the CTP technology.

On the other hand, removal of non-image areas by dissolution after exposure is indispensable for the conventional plate making from a PS plate, so obviation of the necessity for such an additional wet processing is another target for improvement of the prior art. Lately in particular, consideration of world's ecology has become a big concern in all of industries. Therefore, it has been more strongly desired than ever to simplify the processing, effect the processing in a dry process, or make the processing unnecessary from both the viewpoints of ecology and process streamlining associated with the foregoing digitization.

As a method of eliminating a conventional processing process, the following proposal has been made. To be concrete, the proposed mode comprises using a photosensitive layer that enables non-image areas of the printing plate precursor to be removed during a usual printing process. By the use of such a photosensitive layer, the printing plate precursor can be mounted on a printing machine without development process after exposure, and developed on the machine to provide a final printing plate. Such a system of making a lithographic printing plate is referred to as "on-press development system". More specifically, the on-press development can be effected, e.g., by the use of a photosensitive layer capable of dissolving in a fountain solution or an ink solvent and mechanical removal by contact with an impression cylinder or a blanket cylinder installed in a printing machine. However, application of the on-press development system to conventional PS plates has raised a big problem that the printing plate precursors require to be preserved under perfectly light-tight and/or isothermal condition even after exposure, e.g., until the they are mounted in a printing machine, because the photosensitive layer thereof is still in an unfixed condition after exposure.

In the context of the above described technological problems, the method of using a high-output laser, such as semiconductor laser or solid laser (e.g., YAG laser), has become a promising method for plate making by scanning exposure, because such lasers have come to be available at low prices in recent years. In the high-power density exposure system using such a high-output laser, it is possible to utilize various phenomena other than the photo reactions utilized in heretofore known photosensitive materials having suitability for low to medium-power density exposure. For instance, not only chemical changes but also structural changes, such as changes in phase and form, can be utilized as such phenomena. In general, the recording system utilizing such a high-power density exposure is called "heat-mode recording system". This is because, in many of high-power density exposure systems, it is believed that the light energy absorbed in photosensitive materials is converted to heat and the heat thus generated causes the intended phenomena.

A great advantage of such a heat-mode recording system is in that the fixation of image after exposure is not essential.

More specifically, the phenomena utilized for image recording in heat-mode photosensitive materials don't take place in a substantial sense under exposure to light of ordinary intensity or at ordinary environmental temperature, so that the fixation of images after exposure is not essential. Accordingly, the use of photosensitive layers rendered insoluble or soluble by heat-mode exposure makes possible systems capable of producing images by imagewise exposure but undergoing no changes in the images by development (removal of non-image areas) after exposure to, e.g. environmental light for an arbitrary period of time.

According to heat-mode recording, therefore, it becomes possible to obtain lithographic printing plate precursors appropriate for the on-press development described above.

As a suitable method for production of a lithographic printing plate on a basis of heat-mode recording, one method has been put forth that a water-receptive image-forming layer provided on a water-receptive substrate is subjected to imagewise heat-mode exposure, and thereby the exposed area thereof undergoes a change in solubility or dispersibility and the non-exposed area thereof is removed by wet-process development, if needed.

However, the hitherto known printing plate precursors for heat-mode recording have another big problem that the non-image areas thereof are liable to generate scumming or the image areas thereof are low in mechanical strength. In other words, it is necessary to overcome a drawback that the image-forming layer has a smaller solubility change in the part near to the substrate than in the part near to its surface when subjected to heat-mode exposure. More specifically, heat generated by heat-mode exposure in a printing plate precursor of heat-mode recording system is based on light absorption by a light absorbent in the recording layer of the printing plate precursor, so that the quantity of heat generated is great in the surface part of the recording layer and small in the vicinity of the substrate and, therefore, the extent of a change in solubility of the recording layer becomes relatively small in the vicinity of the substrate. As a result, in the case of negative-working printing plate precursors of heat-mode recording type, removal of exposed areas to fundamentally provide a hydrophobic ink-receptive layer has frequently occurred during development and/or in the process of printing. Such a removal of ink-receptive image areas of negative-working printing plate precursors produces a deterioration in printing durability. This problem becomes worse in particular when a metallic sheet having high printing suitability and high thermal conductivity, such as an aluminum sheet, is used as substrate, because thermal diffusion is promoted due to high thermal conductivity of such a substrate and thereby the temperature rise in the vicinity of the substrate is further hindered. In order to achieve a sufficient solubility change in the vicinity of a substrate, it was necessary to apply extremely high exposure energy or carry out after-treatment, such as heating after exposure.

For instance, Japanese Patent 2,938,397 discloses the method of forming images by thermal fusion of fine particles of thermoplastic hydrophobic polymer by exposure to infrared laser beams, mounting a printing plate precursor having the images formed in the foregoing manner on the cylinder of a printing machine, and then developing the printing plate precursor on the printing machine with a fountain solution and/or printing ink. The image formation by simple thermal fusion as in the above described method can ensure good on-press developability, indeed, but the thermal fusion reaction does not occur at the heat-sensitive layer interface with a substrate when the substrate on which the heat-sensitive layer is provided directly is an aluminum substrate, because the aluminum substrate takes the heat generated; as a result, the printing plate obtained has insufficient printing durability.

In JP-A-9-127683 (the term "JP-A" as used herein means an "unexamined published Japanese patent application") or WO99/10186 also, the image formation by thermal fusion of thermoplastic fine particles and on-press development is disclosed. However, sufficient printing durability is not achieved therein, too.

On the other hand, the method of providing an oleophilic heat-sensitive layer on a porous hydrophilic substrate and making the oleophilic heat-sensitive layer adhering thermally to the substrate by exposure to infrared laser beams is disclosed in JP-A-8-48020. However, the oleophilic film is inferior in on-press developability, and a scum of the oleophilic heat-sensitive layer origin adheres to ink rollers and printed matter.

In addition, JP-A-10-287062 discloses the case where an oleophilic heat-sensitive layer is provided on a hydrophilic swelling layer. In this case, the absorption of heat by an aluminum substrate is controlled, but the hydrophilic swelling layer doesn't repel ink well when it is not in a state of swelling with a fountain solution to result in an increase of spoilage.

As described above, heat-sensitive lithographic printing plate precursors capable of ensuring high printing durability as well as good on-press developability haven't been known yet. Therefore, we have made intensive studies of the foregoing problem, and found that both satisfactory on-press developability and high printing durability can be achieved when a lithographic printing plate precursor has on a water-receptive substrate a heat-sensitive layer which comprises microcapsules having outer walls rupturable by heat used for image formation and containing a compound having a functional group capable of causing reaction by the heat, and besides, contains a light-to-heat converting agent in the heat-sensitive layer or a layer adjacent thereto (This finding has been filed as Japanese Patent Application No. 2000-18968).

However, it has turned out that such a lithographic printing plate precursor still have a storage stability problem, namely a problem of loosing on-press developability with a lapse of time to result in generation of scumming in the process of printing.

SUMMARY OF THE INVENTION

Therefore, an object of the present invention is to solve the foregoing newly generated problem and provide a lithographic printing plate precursor which not only can ensure satisfactory on-press developability and high printing durability but also has excellent storage stability.

As a result of our intensive studies, it has been discovered that the above described object can be attained by containing in microcapsules a compound capable of acting as a co-reactant in thermal reaction of a compound having a thermally reactive functional group which is contained in other microcapsules, or using a precursor compound having a reactive functional group in a protected condition and capable of exhibiting its reactivity upon heating as a co-reactant in thermal reaction of a compound having a thermally reactive functional group which is contained in microcapsules.

More specifically, the following are embodiments of the present invention:

1. A lithographic printing plate precursor having a heat-sensitive layer on a water-receptive substrate, with the heat-sensitive layer comprising microcapsules containing a compound having a thermally reactive functional group, and the printing plate precursor further containing in the heat-sensitive layer or a layer adjacent to the heat-sensitive layer a compound capable of acting as a co-reactant in thermal reaction of the compound having a thermally reactive functional group in a state contained in other microcapsules.

2. A lithographic printing plate precursor having a heat-sensitive layer on a water-receptive substrate, the heat-sensitive layer comprising microcapsules containing a compound having a thermally reactive functional group, and the printing plate precursor further containing in the heat-sensitive layer or a layer adjacent to the heat-sensitive layer a precursor compound having a reactive functional group in a protected condition which can exhibit its reactivity upon heating and act as a co-reactant in thermal reaction of the compound having a thermally reactive functional group.

3. The lithographic printing plate precursor as described in Embodiment 2, wherein the precursor compound and the compound having a thermally reactive functional group are contained in the same or different microcapsules.

4. The lithographic printing plate precursor as described in any of Embodiments 1 to 3, wherein the heat-sensitive layer or a layer adjacent to the heat-sensitive layer further comprises a light-to-heat converting agent.

5. The lithographic printing plate precursor as described in any of Embodiments 2 to 4, wherein the precursor compound is a precursor of an amine compound.

6. The lithographic printing plate precursor as described in Embodiment 5, wherein the precursor of an amine compound is an arylsulfonylacetate of an amine compound.

DETAILED DESCRIPTION OF THE INVENTION

The present invention is illustrated below in detail.

The present lithographic printing plate precursor (i.e., the lithographic printing plate precursor of the present invention) has a heat-sensitive layer on a substrate. It may also have a layer structure that a subbing layer is provided on a substrate and a heat-sensitive layer is provided on the subbing layer. Further, the heat-sensitive layer may be coated with a water-soluble overcoat layer. Furthermore, an interlayer may be provided between the substrate and the heat-sensitive layer. In addition, the present lithographic printing plate precursor may also have a layer structure that a water-insoluble water-receptive layer is provided on an aluminum substrate directly or via a heat insulation layer and a heat-sensitive layer is provided on the water-insoluble water-receptive layer.

Therefore, the term "a layer adjacent to the heat-sensitive layer" used in the present invention means a water-soluble overcoat layer, a subbing layer, an interlayer or a water-insoluble water-receptive layer.

The present heat-sensitive layer comprises microcapsules that each contain a compound having a thermally reactive functional group (referred to as a thermally reactive group, too) In one mode of the present invention, a compound acting as a co-reactant in thermal reaction of the compound having a thermally reactive group is micro-encapsulated separately, and contained in the heat-sensitive layer or a layer adjacent to the heat-sensitive layer. In another mode of the present invention, the compound acting as a co-reactant in thermal reaction of the compound having a thermally reactive group is incorporated in the heat-sensitive layer or a layer adjacent thereto in a precursor form that the reactive functional group thereof is protected and can exhibit its reactivity under heating. Such a precursor may be added to the heat-sensitive layer or a layer adjacent thereto as it is or in a micro-encapsulated state. In the case of adding the precursor in a microencapsulated state, the precursor and the compound having a thermally reactive group may be contained in the same microcapsules or separate ones.

Examples of a reaction between thermally reactive groups include addition reaction between an α,β-unsaturated carbonyl group and an amino or thiol group, addition reaction between an isocyanate or blocked isocyanate group and an active hydrogen-containing compound (such as amine, alcohol or carboxylic acid), addition reaction between an epoxy group and an amino, carboxyl or hydroxyl group, condensation reaction between a carboxyl group and a hydroxyl or amino group, and ring opening addition reaction between acid anhydride and an amino or hydroxyl group. However, any reactions may be applied to the present thermal reaction as long as a chemical bond can be formed.

Microcapsules containing such a compound having a thermally reactive group can be obtained by encapsulating in microcapsules a compound having a thermally reactive group, such as an α,β-unsaturated carbonyl group, an epoxy group, an amino group, a hydroxyl group, a carboxyl group, an isocyanate group, an acid anhydride group or protected groups thereof, or by introducing such a compound into the outer walls of microcapsules. It is also all right to encapsulate a compound having a thermally reactive group in microcapsules, and at the same time introduce the compound into the outer walls of the microcapsules.

The suitable molecular weight of a compound having such a thermally reactive group as described above is 2,000 or less. When the compound has its molecular weight in such a range, it can diffuse speedily when it receives heat for image formation, and can get a high probability of its reacting with a co-reactant.

Examples of a α,β-unsaturated carbonyl group include acryloyl group and methacryloyl group, and the α,β-unsaturated carbonyl group-containing compounds suitable for the present invention can be selected from compounds having at least one, preferably at least two, of such groups at their individual molecular ends. The group of such compounds are well known in this industrial field, and may be used in the present invention without any particular restrictions. For instance, such compounds may have any chemical form, such as a monomer, a prepolymer including a dimer, a trimer and oligomers, and a mixture or copolymer of different monomers or prepolymers. Examples of a monomer or monomers forming a copolymer include unsaturated carboxylic acids (such as acrylic acid, methacrylic acid, itaconic acid, crotonic acid, isocrotonic acid and maleic acid), unsaturated carboxylic acid esters and unsaturated carboxylic acid amides. Of these monomers, the esters prepared from unsaturated carboxylic acids and aliphatic polyhydric alcohol compounds and the amides prepared from unsaturated carboxylic acids and aliphatic polyamine compounds are preferred over the others. In addition, unsaturated carboxylic acid esters containing nucleophilic substituents, such as hydroxyl, amino and mercapto groups, adducts of amides and monofunctional or polyfunctional isocyanates or epoxides, and dehydration condensation products of amides and monofunctional or polyfunctional carboxylic acids can be suitably used, too. In addition, the products obtained by addition reaction between unsaturated carboxylic acid esters or amides containing electrophilic substituents, such as isocyanate and epoxy groups, and monofunctional or polyfunctional alcohols. amines or thiols, as well as the products obtained by replacement reaction between unsaturated carboxylic acid esters or amides containing releasing groups, such as halogen and tosyloxy groups, and monofunctional or polyfunctional alcohols, amines or thiols are also suitably used. Other examples, include a group of compounds corresponding to the replacement of unsaturated carboxylic acid part in each of the compounds as described above by an unsaturated phosphonic acid or styrene can be used.

Examples of an α,β-unsaturated carbonyl compound as an unsaturated carboxylic acid ester of aliphatic polyhydric alcohol compound include acrylic acid esters, such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers; methacrylic acid esters, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethyl-methane and bis-[p-(methacryloyloxyethoxy)phenyl]dimethylmethane; itaconic acid esters, such as ethylene glycol diitaconate, propylene glycol diitaconate, 1,3-butanediol diitaconate, hydroquinonebis(2-hydroxyethyl)ether diitaconate, tetramethylene glycol diitaconate, pentaerythritol diitaconate and sorbitol tetraitaconate; crotonic acid esters, such as ethylene glycol dicrotonate, tetramethylene glycol dicrotonate, pentaerythritol dicrotonate and sorbitol tetracrotonate; isocrotonic acid esters, such as ethylene glycol diisocrotonate, pentaerythritol diisocrotonate and sorbitol tetraisocrotonate; and maleic acid esters, such as ethylene glycol dimaleate, triethylene glycol dimaleate, pentaerythritol dimaleate and sorbitol tetramaleate.

Examples of other esters include the aliphatic alcohol esters as disclosed in JP-B-46-27926 (the term "JP-B" as used herein means an "examined Japanese patent publication"), JP-B-51-47334 and JP-A-57-196231, the esters having aromatic skeletons disclosed in JP-A-59-5240, JP-A-59-5241 and JP-A-2-226149, and the amino group-containing esters disclosed in JP-A-1-165613.

Examples of an amide monomer prepared from an aliphatic polyamine compound and an unsaturated carboxylic acid, include methylenebis(acrylamide), methylenebis (methacrylamide), 1,6-hexamethylenebis(acrylamide), 1,6-hexamethylenebis(methacrylamide), diethylene-triaminetris (acrylamide), xylylenebis(acrylamide) and xylylenebis (methacrylamide).

Examples of other suitable amide monomers include the amides having a cyclohexylene structure as disclosed in JP-B-54-21726.

Further, urethane-type α,β-unsaturated carbonyl compounds produced by addition reaction between isocyanate and hydroxyl group are also suitably used. Examples of such compounds include vinylurethane compounds containing at least two polymerizable vinyl groups per molecule, which are produced by addition of a hydroxyl group-containing vinyl monomer represented by the following formula (A) to the polyisocyanate compounds having at least two isocyanate groups per molecule as disclosed in JP-B-48-41708:

$$CH_2{=}C(R^{41})COOCH_2CH(R^{42})OH \qquad (A)$$

wherein $R^{41}$ and $R^{42}$ are each H or $CH_3$.

Furthermore, the urethane acrylates disclosed in JP-A-51-37193, JP-B-2-32293 and JP-B-2-16765, and the urethane compounds having ethylene oxide skeletons as disclosed in JP-B-58-49860, JP-B-56-17654, JP-B-62-39417 and JP-B-62-39418 can be given as suitable examples.

In addition, the α,β-unsaturated carbonyl compounds having an amino or sulfide structure in each molecule as disclosed in JP-A-63-277653, JP-A-63-260909 and JP-A-1-105283 can also be given as suitable examples.

Other examples of compounds which can be appropriately contained in microcapsules include the polyester acrylates and polyfunctional acrylates or methacrylates, such as epoxy (meth)acrylates prepared by reacting epoxy resins with (meth)acrylic acid, as disclosed in JP-A-48-64183, JP-B-49-43191 and JP-B-52-30490. Still other examples, include the specific unsaturated compounds disclosed in JP-B-46-43946, JP-B-1-40337 and JP-B-1-40336.

In some cases, the perfluoroalkyl group-containing compounds disclosed in JP-A-61-22048 are also suitably used. Furthermore, the compounds introduced as photosetting monomers and oligomers in *Nippon Settyaku Kyoukai-Shi* (translated into English, it means "Journal of Japanese Adhesive Society"), Vol. 20, No. 7, pages 300–308 (1984) can be suitably used, too.

Examples of suitable epoxy compounds include glycerol polyglycidyl ether, polyethylene glycol diglycidyl ether, polypropylene diglycidyl ether, trimethylolpropane polyglycidyl ether, sorbitol polyglycidyl ether, and polyglycidyl ethers of bisphenols, polyphenols or hydrogenation products thereof.

Examples of suitable compounds containing isocyanate groups include tolylene diisocyanate, diphenylmethane diisocyanate, polymethylenepolyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, and compounds obtained by blocking the isocyanate groups described above with alcohols or amines.

Examples of suitable amine compounds include ethylenediamine, diethylenetriamine, triethylenetetramine, hexamethylenediamine, propylenediamine and polyethylene-imine.

Examples of suitable compounds containing hydroxyl groups include compounds having terminal methylol groups, polyhydric alcohols (e.g., pentaerythritol, hydroquinonebis(2-hydroxyethyl)ether), bisphenol and polyphenols.

Examples of suitable compounds containing carboxyl groups include aromatic polycarboxylic acids, such as pyromellitic acid, trimellitic acid and phthalic acid, and aliphatic polycarboxylic acids, such as adipic acid.

Examples of suitable acid anhydrides include pyromellitic anhydride and benzophenonetetracarboxylic anhydride.

The present precursor compounds whose reactive functional groups are protected and exhibit their reactivity under action of heat may be compounds whose protection can be released by pyrolysis or nucleophilic reaction in the presence of an acid or base catalyst. Examples of such compounds include compounds containing isocyanate groups blocked by phenols, β-diketone compounds, lactams, oximes, tertiary alcohols, aromatic amines, amides, thiols, heterocyclic compounds or ketoximes; compounds containing carboxylic groups protected by ester formation using tetrahydropyranyl groups, t-butyl groups, t-butyldimethylsilyl groups, N-phthalimidomethyl groups or cinnamyl groups; and compounds containing hydroxyl groups etherified by trimethylsilyl groups, triisopropylsilyl groups or tetrahydropyranyl groups. Examples of amine precursors, include known precursors of decarboxylation type, pyrolysis type, reaction type such as intramolecular nucleophilic reaction, Lossen rearrangement or Beckmann rearrangement type, and complexation type. Other examples of amine precursors include amineimide compounds, dicyanamide compounds, carbazides, $BF_3$-amine complex salts, arylsulfonylacetates of amines, such as phenylsulfonylacetates of amines and 4-(phenylsulfonyl)phenylsulfonylacetates of amines, and the compounds capable of producing amines by heating or reaction that are disclosed as base precursors in JP-A-62-264041, JP-A-5-34909 and JP-A-5-68873. In introducing such a precursor compound as described above into microcapsules, the precursor compound may used in a condition that it is dissolved in a hydrophobic solvent, or dispersed as solid particles in a hydrophobic solvent, or dispersed in water and emulsified in a hydrophobic solvent.

The thermally reactive group-containing compound introduced in microcapsules, which is described above in detail, seep through the surface of microcapsules or is released from the microcapsules by the action of heat generating upon exposure for image formation, and undergoes chemical reaction with a co-reactant contained in other microcapsules and released therefrom similarly by the action of heat, or a co-reactant formed by deprotection of a precursor compound under action of heat. By this chemical reaction, the molecular structure in the heated areas is changed to a three-dimensional cross-linked structure. Accordingly, the heated area has a great difference in solubility in water or an aqueous solution between before and after the exposure for image formation, and shows good on-press developability. Thus, the image areas can have high mechanical strength and ensure high printing durability.

Isolating a thermally reactive compound from a co-reactant by introducing them in separate microcapsules, or using a reactivity-protected precursor compound makes it possible to prevent on-press developability to be impaired through gradual progress of reaction between them with a lapse of time. Therefore, satisfactory storage stability can be achieved as high printing durability is secured.

Suitable examples of a wall material for the present microcapsules include polyurea, polyurethane, polyester, polycarbonate, polyamide, and mixtures of two or more of the polymers described above. Of these wall materials, polyurea and polyurethane are preferred over the others. In the outer walls of microcapsules, as described above, thermally reactive group-containing compounds may be introduced.

For micro-encapsulating the present thermally reactive group-containing compounds or precursor compounds, known methods can be adopted. As methods of producing microcapsules, for instance, there are known the method of utilizing coacervation as disclosed in U.S. Pat. Nos. 2,800,457 and 2,800,458, the method of using interfacial polymerization as disclosed in British Patent 990,443. U.S. Pat. No. 3,287,154, JP-A-38-19574, JP-A-42-446 and JP-A-42-711, the method of using deposition of polymers as disclosed in U.S. Pat. Nos. 3,418,250 and 3,660,304, the method of using an isocyanate-polyol wall material as disclosed in U.S. Pat. No. 3,796,669, the method of using an isocyanate wall material as disclosed in U.S. Pat. No. 3,914,511, the method of using an urea-formaldehyde or urea-formaldehyde-resorcinol wall material as disclosed in U.S. Pat. Nos. 4,001,140, 4,087,376 and 4,089,802, the method of using a melamine-formaldehyde or hydroxycellulose wall material as disclosed in U.S. Pat. No. 4,025,445, the in-situ method utilizing polymerization of monomers as disclosed in JP-B-36-9163 and JP-B-51-9079, the spray drying method as disclosed in British Patent 930,422 and U.S. Pat. No. 3,111,407, and the electrolytic dispersion cooling method as disclosed in British Patents 952,807 and 967,074. However, these methods should not be construed as limiting the methods usable in the present invention.

The suitable average size of the present microcapsules is from 0.01 to 20 μm, preferably from 0.05 to 2.0 μm, particularly preferably from 0.10 to 1.0 μm. When the average size is too large, the resolution is lowered; while, when it is too small, deterioration in storage stability is caused.

The present lithographic printing plate precursor contains a light-to-heat converting agent in the heat-sensitive layer or a layer adjacent thereto, and this agent enables images to be written in the printing plate precursor by irradiation with laser beams.

Such a light-to-heat converting agent may be any of light absorption materials having their respective absorption bands in the wavelength region of a light source used. However, compounds capable of absorbing infrared radiation and converting the absorbed radiation to heat are preferred as such a agent. In particular, materials absorbing light of wavelengths of 700 nm or longer, inclusive various pigments, dyes and metallic fine grains, can be used to advantage.

Pigments utilizable as the light-to-heat converting agent include commercially available pigments and infrared-absorbing pigments described in *Color Index* (*C.I.*) *Binran* (*Color Index* (*C.I.*) *Handbook*), *Saishin Ganryo Binran* (*Handbook of Latest Pigments*), compiled by Nippon Ganryo Gijutsu Kyokai (1977), *Saishin Ganryo Oyo Gijutsu* (*Latest Pigment Application Techniques*), published by CMC Publishing Co., Ltd. (1986), and *Insatsu Ink Gijutsu* (*Printing Ink Techniques*), published by CMC Publishing Co., Ltd. (1984).

For improving dispersibility of those pigments in layers to which they are added, they may undergo hitherto known surface treatment before use, if desired. Suitable examples of a method for surface treatment include a method of coating the pigment surface with a hydrophilic resin or an oleophilic resin, a method of adhering a surfactant to the pigment surface and a method of binding a reactive substance (such as silica sol, alumina sol, silane coupling agents, epoxy compounds and isocyanate compounds) to the pigment surface.

As to pigments added to a water-receptive layer, it is desirable that their surface be coated with a hydrophilic resin or silica sol so as to enable easy dispersion in water-soluble resins and not to impair water-receptivity of the layer. The suitable grain size of pigment is from 0.01 to 1 μm, preferably from 0.01 to 0.5 μm. Dispersion of pigments can be effected using dispersion techniques hitherto adopted for production of ink and toner.

As a pigment capable of absorbing infrared radiation, carbon black is used to particular advantage.

Dyes usable as a light-to-heat converting agent include commercially available dyes and known dyes as described in literature (e.g., *Senryou Binran* (Handbook of Dyes), compiled by Yuki Gosei Kagaku Kyokai (1970), *Kagaku Kogyo* (Chemical Industry), entitled "Near Infrared Absorbing Dyes", May issue, pp. 45–51 (1986), and 90 *Nendai Kinousei Shikiso no Kaihatsu to Shijo Doukou* (Development and Market Trends of Functional Dyes in 1990s), chapter 2, section 3, CMC Publishing Co., Ltd. (1990)) and patents. Suitable examples of dyes include infrared absorbing dyes, such as azo dyes, metal complex azo dyes, pyrazolone azo dyes, anthraquinone dyes, phthalocyanine dyes, carbonium dyes, quinoneimine dyes, polymethine dyes and cyanine dyes.

Further, examples of infrared absorbing dyes used advantageously, include the cyanine dyes as disclosed in JP-A-58-125246, JP-A-59-84356 and JP-A-60-78787, the methine dyes as disclosed in JP-A-58-173696, JP-A-58-181690 and JP-A-58-194595, the naphthoquinone dyes as disclosed in JP-A-58-112793, JP-A-58-224793, JP-A-59-48187, JP-A-59-73996, JP-A-60-52940 and JP-A-60-63744, the squarylium dyes as disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, the dyes disclosed in JP-A-10-268512 and the phthalocyanine compounds disclosed in JP-A-11-235883.

In addition, the near infrared absorption sensitizers disclosed in U.S. Pat. No. 5,156,938 can be suitably used as dyes. Besides the dyes described above, the substituted arylbenzo(thio)pyrylium salts disclosed in U.S. Pat. No. 3,881,924, the trimethinethiapyrylium salts disclosed in JP-A-57-142645, the pyrylium compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethine-thiopyrylium salts disclosed in U.S. Pat. No. 4,283,475, the pyrylium compounds disclosed in JP-B-5-13514 and JP-B-5-19702, and Epolite III-178, Epolite III-130 and Epolite III-125 (produced by Epoline Co., Ltd.) can be favorably used.

Of those dyes, water-soluble dyes are preferred as dyes added to a hydrophilic matrix, such as a hydrophilic resin in the heat-sensitive layer. Examples of such dyes are illustrated below:
(IR-1)
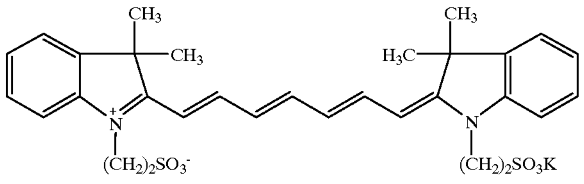
(IR-2)
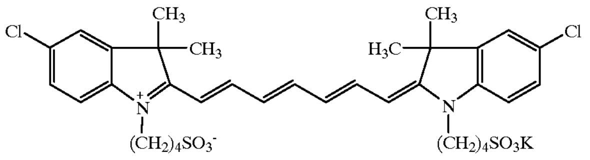
(IR-3)
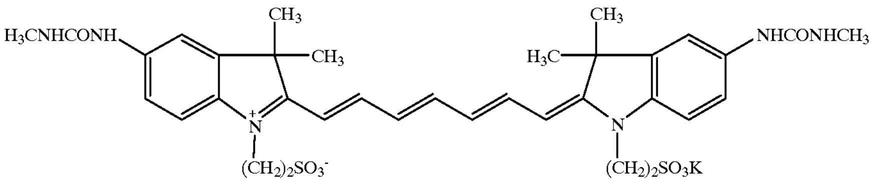
(IR-4)
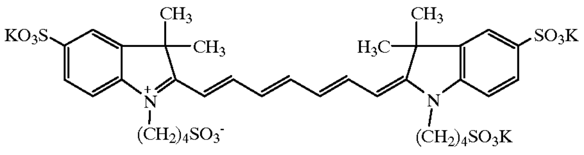
(IR-5)
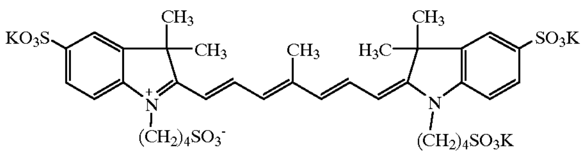
(IR-6)
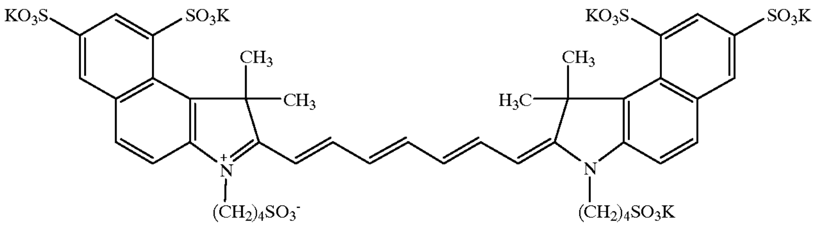
(IR-7)
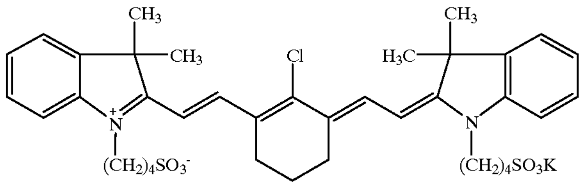
(IR-8)
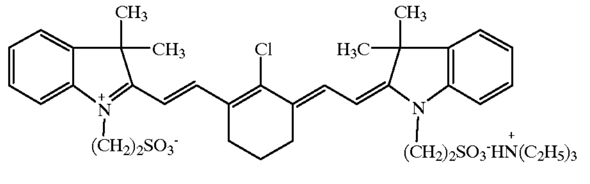
(IR-9)
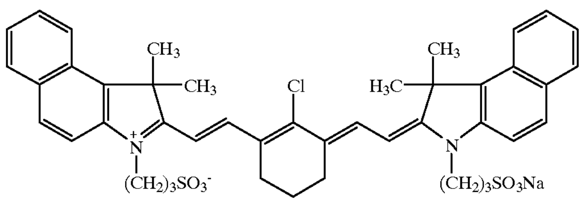
(IR-10)
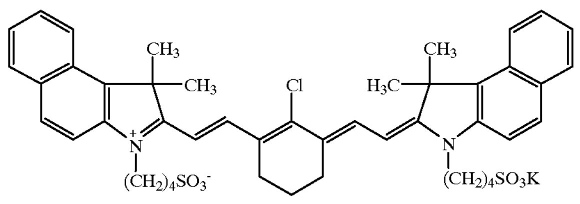

-continued (IR-11)

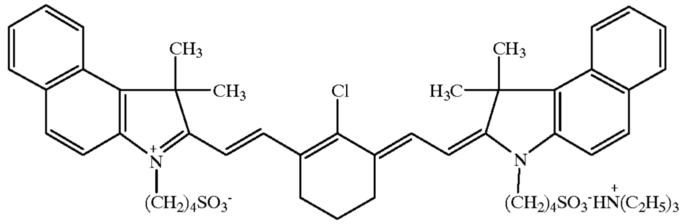

The light-to-heat conversion agent added to oleophilic materials, e.g., encapsulated in microcapsules constituting the present heat-sensitive layer may be an infrared absorbing dye as described above, but oleophilic dyes are more suitable therefor. Examples of such oleophilic dyes, include the following dyes:

(IR-21)

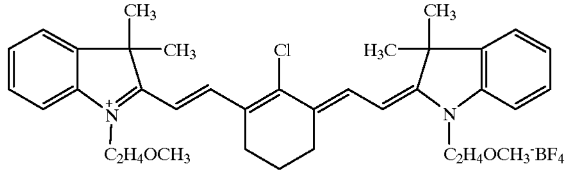

(IR-22)

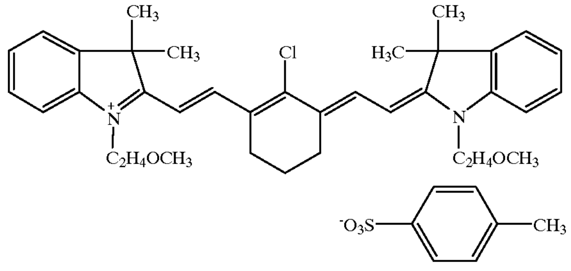

(IR-23)

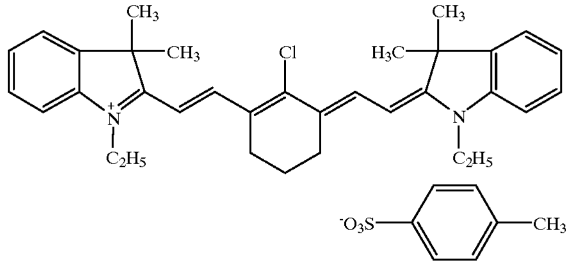

(IR-24)

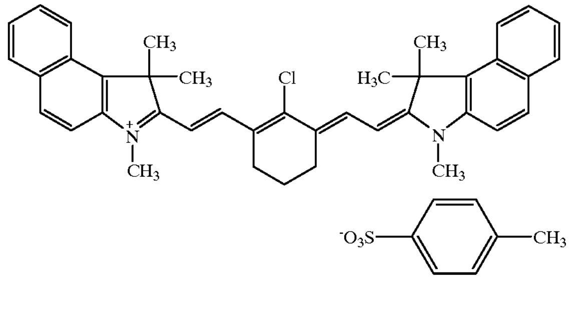

-continued (IR-25)

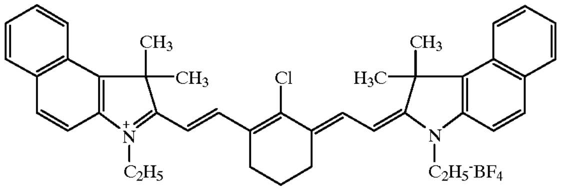

(IR-26)

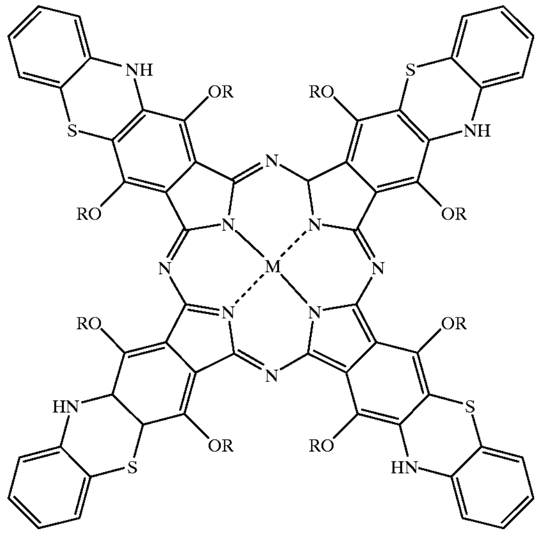

M = VO,
R = i-$C_5H_{11}$ (IR-27)

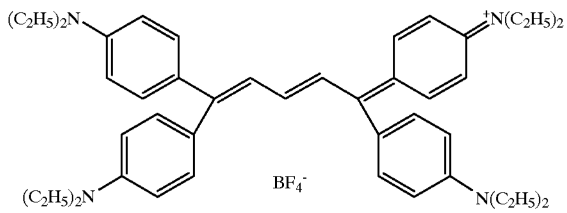

The light-to-heat converting agent used in the present heat-sensitive layer maybe metallic fine grains as well. Many kinds of metallic fine grains have light-to-heat converting properties, and besides, they are self-exothermic. Suitable examples of metallic fine grains include fine grains of a simple metallic substance, such as Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re or Sb, fine grains of an alloy of two or more metallic elements selected from the above-described ones, fine grains of an oxide of one or more metallic elements selected from the above-described ones and fine grains of a sulfide of one or more metallic elements selected from the above-described ones.

As to the metals constituting the foregoing metallic fine grains, metals which tend to heat-fused by the action of heat at the time when they are irradiated to light, have a melting point of about 1,000° C. or below and absorb light in the infrared, visible or ultraviolet region, such as Re, Sb, Te, Au, Ag, Cu, Ge, Pb and Sn, are preferable.

The metals especially preferred as those constituting metallic fine grains are metals having a relatively low melting point and showing relatively high absorbance to heat rays, with examples including Ag, Au, Cu, Sb, Ge and Pb. Of these metals, Ag, Au and Cu are advantageous in particular.

Further, the metallic fine grains may be constituted of two or more different types of light-to-heat converting materials. For instance, fine grains of a metal having a low melting point, such as Re, Sb, Te, Au, Ag, Cu, Ge, Pb or Sn, and fine grains of a self-exothermic metal, such as Ti, Cr, Fe, Co, Ni, W or Ge, can be used as a mixture. In addition, it is appropriate to use fine fragments of a metal species capable of showing especially strong absorption when reduced to fine pieces, such as Ag, Pt or Pd, in combination with other metal fine pieces.

Surface treatment of the metallic fine grains as described above for imparting water-receptivity thereto can increase the effects of the present invention. Examples of a means of imparting water-receptivity to the metallic fine grain surface, include surface treatment with a hydrophilic compound which can be adsorbed to the grains, such as a surfactant, surface treatment with a substance having a hydrophilic group which can react with a constituent of the fine grains, and formation of a protective colloidal hydrophilic polymer film on the fine grain surface. Of these means, the surface treatment with a silicate is preferred over the others. In the case of iron fine grains, for instance, sufficient water-receptivity can be imparted to the iron fine grain surface by immersing iron fine grains in an aqueous solution (3%) of sodium silicate at 70° C. for 30 seconds. In a similar manner thereto, other metallic fine grains can undergo surface treatment with a silicate.

The suitable size of those fine grains is not greater than 10 $\mu$m, preferably from 0.003 to 5 $\mu$m, particularly preferably from 0.01 to 3 $\mu$m. The more minute the fine grains are in size, the lower solidification temperature they have, so the more the photosensitivity in heat mode is increased. Therefore, it is advantageous to make the fine grains more minute in size. However, the grains more minute in size are difficult to disperse. Conversely, the grains having sizes greater than 10 $\mu$m causes deterioration in definition of printed matter.

To the heat-sensitive layer of the present lithographic printing plate precursor, hydrophilic resins can be added. By the addition of hydrophilic resins, the on-press developability can be improved, and besides, the heat-sensitive layer itself can have enhanced film strength. As hydrophilic resins, those having no three-dimensional cross-links are preferred because of their good on-press developability.

Suitable hydrophilic resins are resins having hydrophilic groups, such as hydroxyl, carboxyl, hydroxyethyl, hydroxypropyl, amino, aminoethyl, aminopropyl and carboxymethyl groups. Examples of such hydrophilic resins include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, hydroxyethyl methacrylate homopolymer and copolymers, hydroxyethyl acrylate homopolymer and copolymers, hydroxypropyl methacrylate homopolymer and copolymers, hydroxypropyl acryl ate homopolymer and copolymers, hydroxybutyl methacrylate homopolymer and copolymers, hydroxybutyl acrylate homopolymer and copolymers, polyethylene glycols, hydroxypropylene polymers, polyvinyl alcohols, polyvinyl acetate having a hydrolysis degree of at least 60 weight %, preferably at least 80 weight %, polyvinyl formal, polyvinyl butyral, polyvinyl pyrrolidone, acrylamide homopolymer and copolymers, methacrylamide homopolymer and copolymers, N-methylolacrylamide homopolymer and copolymers, and 2-acrylamido-2-methylpropanesulfonic acid or 2-acrylamido-2-methylpropanesulfonate homopolymer and copolymers.

The suitable proportion of such a hydrophilic resin in the present heat-sensitive layer is from 2 to 40%, preferably from 3 to 30%. When the hydrophilic resin is added in a proportion lower than 2%, the film strength becomes weak; while the proportion is higher than 40%, on-press developability is heightened but printing durability is lowered.

As the microcapsules containing compounds having thermally reactive groups as described above are incorporated in the heat-sensitive layer of the present lithographic printing plate precursor, compounds capable of initiating or promoting those thermal reactions may be added, if needed. Examples of a reaction-initiating or promoting compound, include compounds capable of generating radicals or cations under the action of heat, such as lophine dimer, trihalomethyl compounds, peroxides, azo compounds, onium salts including diazonium salts and diphenyliodonium salts, acylphosphine and imidosulfonate.

These compounds can be added in a proportion of 1 to 20 weight %, preferably 3 to 10 weight %, to the total solid contents of the heat-sensitive layer. The addition of those compounds in a proportion higher than 20 weight % causes deterioration in on-press developability, while the addition in a proportion lower than 1 weight % cannot produce satisfactory reaction-initiating or promoting effect to result in deterioration of printing durability.

In the present invention, various compounds other than the above-described compounds may be added, if desired. For instance, dyes having strong absorption in the visible region can be used as an image-coloring agent. Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (products of Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes disclosed in JP-A-62-293247. Further, pigments such as phthalocyanine pigments, azo pigments, carbon black and titanium dioxide can be used appropriately for the above purpose.

As the coloring agent as described above makes it easy to distinguish image areas from non-image areas after image formation, the addition thereof is preferable. Those coloring agents are added in a proportion of 0.01 to 10 weight % to the total solid contents in a coating composition for the heat-sensitive layer.

For the purpose of inhibiting α,β-unsaturated carbonyl compounds from undergoing unnecessary radical thermal polymerization during the preparation or storage of a coating composition for the present heat-sensitive layer, it is desirable to add a small amount of thermal polymerization inhibitor to the coating composition. Suitable examples of such a thermal polymerization inhibitor include hydroquinone, p-methoxyphenol, di-t-butyl-p-cresol, pyrogallol, t-butylcatechol, benzoquinone, 4,4-thiobis(3-methyl-6-t-butylphenol), 2,2'-methylenebis(4-methyl-6-t-butylphenol) and N-nitroso-N-phenylhydroxyamine aluminum salt. It is appropriate that those thermal polymerization inhibitors be added in a proportion of about 0.01 to about 5 weight % to the total ingredients in the coating composition.

To the coating composition for the present heat-sensitive layer, nonionic surfactants as disclosed in JP-A-62-251740 and JP-A-3-208514, and amphoteric surfactants as disclosed in JP-A-59-121044 and JP-A-4-13149 can further be added for the purpose of enhancing on-press developability in the unexposed areas.

Examples of a nonionic surfactant usable for such a purpose include sorbitan tristearate, sorbitan monopalmitate, sorbitan trioleate, stearic acid monoglyceride and polyoxyethylene nonyl phenyl ether. Examples of a usable amphoteric surfactant include alkyldi(aminoethyl)glycine, alkylpolyaminoethylglycine hydrochloride, 2-alkyl-N-carboxyethyl-N-hydroxyethylimidazolium betaine, and N-tetradecyl-N,N-betaine type surfactants (e.g., Amorgen K, trade name, a product of Dai-ichi Kogyo Co., Ltd.). The suitable proportion of such a nonionic surfactant and a amphoteric surfactant as described above in a coating composition for the heat-sensitive layer is from 0.05 to 15 weight %, preferably from 0.1 to 5 weight %.

In addition, if necessary for imparting flexibility to the layer coated, plasticizers are added to a coating composition for the present heat-sensitive layer. Examples of a plasticizer usable therefor include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

For producing the present lithographic printing plate precursor, a coating composition prepared by dissolving in a solvent the foregoing ingredients required for the present heat-sensitive layer is coated on an appropriate substrate. Examples of a solvent usable therein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water. However, these examples should not be construed as limiting solvents usable for the forgoing purpose. Those solvents may be used alone or as mixtures thereof. The suitable concentration of the foregoing ingredients (the total solid contents inclusive of additives) in the solvent is from 1 to 50 weight %.

The suitable coverage (on a solids basis) of the heat-sensitive layer formed on the substrate by coating and drying the coating composition, though depends on the end use purpose, is generally from 0.5 to 5.0 $g/m^2$. For forming the present heat-sensitive layer, various coating methods can be used, with examples including bar coater coating, spin coating, spray coating, curtain coating, dip coating, air knife coating, blade coating and roll coating methods. Although the apparent sensitivity becomes higher the smaller coverage the heat-sensitive layer has, the film properties of the heat-sensitive layer to fulfill an image-recording function are decreased.

To a coating composition for the present heat-sensitive layer, surfactants, e.g., the fluorine-containing surfactants as disclosed in JP-A-62-170950, can be added for improving coating properties. The suitable proportion of such surfactants to the total solid contents of the heat-sensitive layer is from 0.01 to 1 weight %, preferably from 0.05 to 0.5 weight %.

For preventing the contamination of the heat-sensitive layer surface with oleophilic materials, the present lithographic printing plate precursor can have on the heat-sensitive layer a water-soluble overcoat layer. It is required for the water-soluble overcoat layer used in the present invention to be removed easily at the time of printing, and the overcoat layer comprises at least one resin selected from water-soluble organic high molecular compounds. The water-soluble organic high molecular compounds usable therein are compounds capable of forming films when coated and dried, with examples including polyvinyl acetate (having a hydrolysis factor of at least 65%), polyacrylic acid and alkali metal or amine salts thereof, acrylic acid copolymers and alkali metal or amine salts thereof, polymethacrylic acid and alkali metal or amine salts thereof, methacrylic acid copolymers and alkali metal or amine salts thereof, polyacrylamide and acrylamide copolymers, polyhydroxyethyl acrylate, polyvinyl pyrrolidone and polyvinyl pyrrolidone copolymers, polyvinyl methyl ether, polyvinyl methyl ether-maleic anhydride copolymer, poly-2-acrylamide-2-methyl-1-propanesulfonic acid and alkali metal or amine salts thereof, poly-2-acrylamide-2-methyl-1-propanesulfonic acid copolymers and alkali metal or amine salts thereof, gum arabic, cellulose derivatives (such as carboxymethyl cellulose, carboxyethyl cellulose and methyl cellulose) and denatured products thereof, white dextrin, pullulan and enzyme-decomposed etherified dextrin. These resins may be used as a mixture of two or more thereof, if desired.

The overcoat layer provided as a layer adjacent to the heat-sensitive layer can contain a precursor compound as a co-reactant of the thermally reactive group-containing compound encapsulated in microcapsules constituting the heat-sensitive layer.

To the overcoat layer, the water-soluble light-to-heat converting agents as described above may further be added.

In the case of forming the overcoat layer by coating an aqueous solution, nonionic surfactants, such as polyoxyethylene nonyl phenyl ether and polyoxyethylene dodecyl ether, can be added to the solution for the purpose of ensuring the uniformity in the layer coated.

The suitable coverage (on a solids basis) of the overcoat layer is from 0.1 to 2.0 $g/m^2$. When the coverage of an overcoat layer is less than 0.1 $g/m^2$, the overcoat layer cannot prevent the generation of fingerprint stains on the heat-sensitive layer surface; while, when the coverage is more than 2.0 $g/m^2$, the on-press developability is impaired.

Then, materials for a substrate usable in the present invention are described below in detail.

In the present lithographic printing plate precursor, a dimensionally stable sheet-form (including plate form) material can be used as a water-receptive substrate on which the heat-sensitive layer can be coated. Suitable examples of such a material include paper, plastic-laminated paper (e.g., polyethylene-, polypropylene- or polystyrene-laminated paper), a metal sheet (e.g., an aluminum, zinc or copper sheet), a plastic film (e.g., a film of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film on which the metal as described above is laminated or deposited. Of these materials, the substrates preferably used are a polyester film and an aluminum sheet.

As the substrate used for the present lithographic printing plate precursor, an aluminum sheet can be used to advantage because of its light weight, excellent surface treatment suitability, processing easiness and high corrosion resistance. Examples of an aluminum material available for this purpose, include JIS 1050 aluminum, JIS 1100 aluminum, JIS 1070 aluminum, Al—Mg alloy, Al—Mn alloy, Al—Mn—Mg alloy, Al—Zr alloy and Al—Mg—Si alloy.

Known techniques on aluminum materials available for a substrate are enumerated below.

(1) On JIS 1050 Aluminum:

Examples of a known technique include the techniques disclosed in JP-A-59-153861, JP-A-61-51395, JP-A-62-146694, JP-A-60-215725, JP-A-60-215726, JP-A-60-215727, JP-A-60-215728, JP-A-61-272357, JP-A-58-11759, JP-A-58-42493, JP-A-58-221254, JP-A-62-148295, JP-A-4-254545, JP-A-4-165041, JP-B-3-68939, JP-A-3-234594, JP-B-1-47545 and JP-A-62-140894. In addition, such techniques are disclosed in JP-B-1-35910 and JP-B-55-28874, too.

(2) On JIS 1070 Aluminum:

Examples of a known technique include the techniques disclosed in JP-A-7-81264, JP-A-7-305133, JP-A-8-49034, JP-A-8-73974, JP-A-8-108659 and JP-A-8-92679.

(3) On Al—Mg Alloy:

Examples of a known technique include the techniques disclosed in JP-B-62-5080, JP-B-63-60823, JP-B-3-61753, JP-A-60-203496, JP-A-60-203497, JP-B-3-11635, JP-A-61-274993, JP-A-62-23794, JP-A-63-47347, JP-A-63-47348, JP-A-63-47349, JP-A-64-61293, JP-A-63-135294, JP-A-63-87288, JP-B-4-73392, JP-B-7-100844, JP-A-62-149856, JP-B-4-73394, JP-A-62-181191, JP-B-5-76530, JP-A-63-30294 and JP-B-6-37116. In addition, such techniques are disclosed in JP-A-2-215599 and JP-A-61-201747, too.

(4) On Al—Mn Alloy:

Examples of a known technique include the techniques disclosed in JP-A-60-230951, JP-A-1-306288 and JP-A-2-293189. In addition, such techniques are disclosed in JP-B-54-42284, JP-B-4-19290, JP-B-4-19291, JP-B-4-19292, JP-A-61-35995, JP-A-64-51992, U.S. Pat. Nos. 5,009,722 and 5,028,276, and JP-A-4-226394, too.

(5) On Al—Mn—Mg Alloy:

Examples of a known technique include the techniques disclosed in JP-A-62-86143, JP-A-3-222796, JP-B-63-60824, JP-A-60-63346, JP-A-60-63347, European Patent 223737, JP-A-1-283350, U.S. Pat. No. 4,818,300, and British Patent 1,222,777.

(6) On Al—Zr Alloy:

Examples of a known technique include the techniques disclosed in JP-B-63-15978, JP-A-61-51395, JP-A-63-143234 and JP-A-63-143235.

(7) On Al—Mg—Si Alloy:

The techniques are disclosed in British Patent 1,421,710.

For production of aluminum sheets usable for the present substrate, the following methods can be adopted.

Forging of metallic aluminum having impurity contents as described above or aluminum alloy having the composition as described above is subjected to cleaning treatment, and then cast. In the cleaning treatment, flux treatment, degassing treatment using Ar gas or Cl gas. filtering treatment using the so-called rigid media filter, such as a ceramic tube filter or a ceramic foam filter, alumina flakes or alumina balls as a filtering material or a glass cloth filter, or the combination of degassing and filtering treatments is carried out for removing undesired gases, such as hydrogen, in the forging. For preventing defects ascribable to foreign substances, such as nonmetallic inclusions and oxides, and gases dissolved in the forging and defects due to gases introduced in forging, it is desirable to perform those treatments for cleaning.

The descriptions of filtering treatment of the forging can be found, e.g., in JP-A-6-57342, JP-A-3-162530, JP-A-5-140659, JP-A-4-231425, JP-A-4-276031, JP-A-5-311261 and JP-A-6-136466.

The descriptions of degassing treatment for the forging can be found, e.g., in JP-A-5-51659, JP-A-5-51660, JP-A-U-5-49146 (the term "JP-A-U" as used herein means an "unexamined published Japanese utility model application"), and JP-A-7-40017.

Casting is carried out using the forging having undergone the cleaning treatment as described above. The casting methods can be classified under two groups, methods using a fixed mold, typified by a DC casting method, and methods using a driven mold, typified by a continuous casting method.

When the DC casting methods are adopted, the forging is solidified at a cooling speed of 1 to 300° C./sec. When the cooling speed is lower than 1° C./sec, many large-size intermetallic compounds are formed.

As to the continuous casting methods, the methods of using cooling rolls, typified by Hunter method and 3C method, and the methods of using a cooling belt and cooling blocks, typified by Hazelett method and Alswiss Caster Model II, are adopted industrially. When the continuous methods are adopted, the forging is solidified at a cooling speed of 100 to 1,000° C./sec. As the continuous casting methods are generally faster in cooling speed than the DC casting methods, they can heighten solid solubilities of alloyed elements to an aluminum matrix. The descriptions of continuous casting methods can be found, e.g., in JP-A-3-79798, JP-A-5-201166, JP-A-5-156414, JP-A-6-262203, JP-A-6-122949, JP-A-6-210406 and JP-A-6-252308.

When the DC casting is carried out, ingot having a thickness of 300 to 800 mm can be produced. The ingot produced is planed off in a usual manner to cut away its surface part in a thickness of 1 to 30 mm, preferably 1 to 10 mm. Thereafter, the resulting ingot is subjected to soaking treatment, if needed. It is appropriate that the heating be carried out for 1 to 48 hours at a temperature of 450 to 620° C. so as not to form large-size intermetallic compounds. When the heating time is shorter than 1 hour, sufficient soaking effect cannot be produced. Then, the ingot is made into a rolled aluminum plate by undergoing hot rolling and cold rolling. The hot rolling is initiated when the ingot temperature comes down to the range of 350 to 500° C. Before, after or during the cold rolling, intermediate annealing treatment may be carried out. The suitable conditions for the intermediate annealing are as follows: When an annealing furnace of batch type is used, the heating treatment is carried out at 280–600° C. for 2 to 20 hours, preferably at 350–500° C. for 2 to 10 hours; while, when a continuous annealing furnace is used, the heating treatment is carried out at 400–600° C. for 360 seconds or shorter, preferably at 450–550° C. for 120 seconds or shorter. The heating at a temperature raising speed of 10° C./sec or above by the use of a continuous annealing furnace makes it possible to render the crystallographic texture minute.

In the foregoing process, the rolled Al plate is completed with the desired thickness of from 0.1 to 0.5 mm. Further, the planarity of the rolled plate may be improved by means of a leveling machine, such as a roller leveler or a tension leveler. The improvement of planarity may be carried out after cutting the Al plate into sheets. For enhancing the productivity, however, it is appropriate that the Al plate be subjected to planarity improving treatment in a continuously coiled condition. Furthermore, the Al plate is generally passed through a slitter line, and thereby worked so as to have the intended width. The Al plate cut with a slitter has at the edge surface either or both of shear plane and fracture plane formed by the slitter blade.

It is appropriate that the plate should have a thickness accuracy of within ±10 $\mu$m, preferably within ±6 $\mu$m, over the total length of the coil. And the plate thickness difference in the width direction is within ±6 $\mu$m, preferably within ±3 $\mu$m. In addition, the appropriate accuracy of the plate width is within ±1.0 mm, preferably within ±0.5 mm. The surface roughness of the Al plate is subject to the surface roughness of the reduction roll used. However, it is advisable that the plate surface is completed so as to finally have a center-line surface roughness (Ra) of about 0.1 to 1.0 $\mu$m. When the Al sheet having a too great Ra value is subjected to graining treatment and coated with a heat-sensitive layer with the intention of preparing a lithographic printing plate, the rough rolling streaks transferred from the pressure roll onto the Al sheet surface is seen through the heat-sensitive layer to mar the appearance. On the other hand, the Ra values of less than 0.1 $\mu$m are undesirable from the industrial point of view because it is necessary for the pressure roll surface to be finished so as to have too low roughness.

In order to prevent abrasions from being generated by friction between Al plates. the Al plate surface may be coated with a thin oil film. Such an oil film may be volatile or non-volatile depending on the situation. When the oil coverage is too great, slip troubles are caused on production lines. On the other hand, the absence of oil causes abrasions during the transport of an Al plate wound up in a coil. Therefore, the suitable coverage of oil is from 3 mg/m$^2$ to 100 mg/m$^2$, and the upper limit of the oil coverage is preferably 50 mg/m$^2$, particularly preferably 10 mg/m$^2$. The description of cold rolling can be found, e.g., in JP-A-6-210308.

When the continuous casting is performed using, e.g., a cooling roll in accordance with Hunter method, a plate having a thickness of 1 to 10 mm can be cast and rolled directly and continuously, so such a method has an advantage of enabling omission of a hot rolling process.

Also, when the cooling roll such as Hazelett method is used, a cast plate having a thickness of 10 to 50 mm can be cast and generally the continuous casting rolled plate having a thickness of 1 to 10 mm can be obtained by rolling continuously with arrangement of a hot rolling roll immediately after casting.

Similarly to the case of DC casting, the rolled plate produced by continuous casting is finished as a plate having a thickness of 0.1 to 0.5 mm by undergoing cold rolling, intermediate annealing, planarity improvement and slitting processes. For the intermediate annealing conditions and cold rolling conditions in the case of adopting continuous casting methods, the descriptions in, e.g., JP-A-6-220593, JP-A-6-210308, JP-A-7-54111 and JP-A-8-92709 can be referred to.

The Al sheets produced in the foregoing processes are subjected to surface treatments including surface-roughening treatment, and coated with a heat-sensitive layer, and thereby made into lithographic printing plate precursors. The surface-roughening treatment is effected using mechanically, chemically and electrochemically surface-roughening methods independently or in combination. In addition, it is preferable to carry out anodic oxidation treatment for securing scratching resistance and water receptivity-increasing treatment.

Further, the treatments of substrate surface are described below in detail.

Prior to the roughening of an aluminum plate, the rolling oil on the surface is removed, if needed. For the oil removal, the degreasing treatment with a surfactant, an organic solvent or an alkaline aqueous solution may be adopted. When an alkali is used therein, neutralization and desmutting with an acidic solution may further be carried out.

Then, the substrate surface is roughened by the so-called graining treatment for the purposes of improving adhesion of the substrate to a heat-sensitive layer and imparting water-retaining properties to non-image areas. As methods for the graining treatment, there are mechanical graining methods, such as sandblasting, ball graining, wire graining, brush graining using a nylon brush and abrasive-water slurry, and hone graining carried out by spraying abrasive-water slurry on the substrate surface at high pressure. Further, there are chemical graining methods wherein the substrate surface is roughened with an etching agent, such as an alkali, an acid or a mixture thereof. Furthermore, there can be adopted the electrochemical graining methods as disclosed in British Patent 896,563, JP-A-53-67507, JP-A-54-146234 and JP-B-48-28123, the combination of mechanical and electrochemical graining methods as disclosed in JP-A-53-123204 and JP-A-54-63902, the combination of mechanical graining method and chemical graining method with a saturated aqueous solution of aluminum salt of mineral acid as disclosed in JP-A-56-55261. On the other hand, the rough surface may be formed by adhering particles to the substrate surface by the use of adhesive or a like method, or by pressing the substrate surface on a continuous belt or a roll having minute asperity to transfer the asperity onto the substrate surface.

Two or more of those surface-roughening methods may be used in combination, and the order and the number of repetition times of those treatments can be chosen arbitrarily. In performing two or more types of surface-roughening treatments, chemical treatment with an acidic or alkaline aqueous solution maybe inserted between successive treatments in order to proceed with each treatment uniformly. Examples of an acidic or alkaline aqueous solution used therein include aqueous solutions of acids, such as hydrofluoric acid, fluorozirconic acid, phosphoric acid, sulfuric acid, hydrochloric acid and nitric acid, and those of alkalis, such as sodium hydroxide, sodium silicate and sodium carbonate. These aqueous solutions may be used alone or as a mixture thereof. For the chemical treatment with such an aqueous solution, it is common practice that the aqueous solution having an acid or alkali concentration of 0.05 to 40 weight % is used and the treatment is carried out at a temperature of 40 to 100° C. for 5 to 300 seconds.

On the substrate surface having undergone the above described surface-roughening treatments, namely graining treatments, smuts are formed. For removal of the smuts, it is generally preferable to carry out washing treatment or etching treatment with an alkali. Examples of such treatments, include the method of etching with an alkali as disclosed in JP-B-48-28123 and the method of desmutting with sulfuric acid as disclosed in JP-A-53-12739.

In the case of an aluminum substrate used in the present invention, on the substrate surface having undergone the pre-treatments as described above is generally formed an oxide film by anodic oxidation for the purpose of improving abrasion resistance, chemical resistance and water retention.

For anodic oxidation of the aluminum plate, any electrolytes can be used as far as they can form a porous oxide film.

In general, sulfuric acid, phosphoric acid, oxalic acid, chromic acid and mixtures thereof are usable as the electrolytes. The suitable electrolyte concentration can be determined appropriately depending on what kind of electrolyte is used. The conditions for anodic oxidation treatment change variously depending on the electrolyte used, so they cannot be generalized. However, according to normal standards of anodic oxidation, the appropriate electrolyte concentration is from 1 to 80 weight %, the electrolytic solution temperature is from 5 to 70° C., the current density is from 5 to 60 ampere/$dm^2$, the voltage is from 1 to 100 V and the electrolysis time is from 10 to 300 seconds. The suitable coverage of anodized layer in the present invention is at least 1.0 g/$m^2$, preferably from 2.0 to 6.0 g/$m^2$. When the coverage is less than 1.0 g/$m^2$, the lithographic printing plate produced cannot have satisfactory printing durability and tends to suffer abrasions in the non-image areas and generate the so-called scratching stains, or adhesion of ink to abraded spots during the process of printing.

Additionally, the substrate for a lithographic printing plate receives anodic oxidation on the side where it is subjected to printing operations, but an anodized layer of 0.01 to 3 g/$m^2$ is generally formed also on the rear side of the substrate because electric flux goes around to the substrate's rear. On the other hand, it is possible to carry out anodic oxidation treatment in an alkaline aqueous solution (e.g., an aqueous sodium hydroxide solution having a concentration of several %) or an fused salt, or anodic oxidation treatment for forming non-porous anodized layer by the use of, e.g., an aqueous ammonium borate solution.

Prior to the anodic oxidation treatment, it is also possible to carry out the formation of a hydrated oxide film as disclosed in JP-A-4-148991 and JP-A-4-97896, the treatment in metal silicate solutions as disclosed in JP-A-63-56497 and JP-A-63-67295, or the conversion coating formation treatment disclosed in JP-A-56-144195.

After anodic oxidation treatment, the aluminum substrate used in the present lithographic printing plate precursor can be treated with an organic acid or a salt thereof, or provided with a layer comprising an organic acid or a salt thereof. This layer can act as a subbing layer of the present heat-sensitive layer. Examples of an organic acid and its salt usable therein, include organic carboxylic acids, organic phosphonic acids, organic sulfonic acids and salts thereof. Of these acids and salts, organic carboxylic acids and the salts thereof are preferred over the others. Examples of such organic carboxylic acids and salts thereof include aliphatic monocarboxylic acids, such as formic acid, acetic acid, propionic acid, butyric acid, lauric acid, palmitic acid and stearic acid; unsaturated aliphatic monocarboxylic acids, such as oleic acid and linolic acid; aliphatic dicarboxylic acids, such as oxalic acid, succinic acid, adipic acid and maleic acid; oxycarboxylic acids, such as lactic acid, gluconic acid, malic acid, tartaric acid and citric acid; aromatic carboxylic acids, such as benzoic acid, mandelic acid, salicylic acid and phthalic acid; and the group Ia, IIb, IIIb, IVa, VIb and VIII metal salts and ammonium salts of the acids as described above. Of these salts of organic carboxylic acids, the above-described metal or ammonium salts of formic acid, acetic acid, butyric acid, propionic acid, lauric acid, oleic acid, succinic acid and benzoic acid are preferred over the others. These compounds may be used alone or as mixtures of two or more thereof.

It is appropriate that those compounds be dissolved in water or alcohol so as to have a concentration of 0.001 to 10 weight %, preferably 0.01 to 1.0 weight %. As to suitable conditions for the immersion treatment in such a solution, the treatment temperature is from 25 to 95° C., preferably from 50 to 95° C., the pH of the solution is from 1 to 13, preferably 2 to 10, and the immersion time is from 10 seconds to 20 minutes, preferably 10 seconds to 3 minutes. The solution specified above may be coated on the aluminum substrate.

After the anodic oxidation treatment, the substrate may further receive treatment with solutions containing the compounds as described below, or these compounds may be coated on the substrate to form a subbing layer of the present heat-sensitive layer. Suitable examples of such compounds include organic phosphonic acids, such as substituted or unsubstituted phenylphosphonic acids, naphthylphosphonic acids, alkylphosphonic acids, glycerophosphonic acids, methylenediphosphonic acids and ethylenediphosphonic acids; organic phosphoric acids, such as unsubstituted or substituted phenylphosphoric acids, naphthylphosphoric acids, alkylphosphoric acids and glycerophosphoric acids; organic phosphinic acids, such as unsubstituted or substituted phenylphosphinic acids, naphthylphosphinic acids, alkylphosphinic acids and glycerophosphinic acids; amino acids, such as glycine, β-alanine, valine, serine, threonine, asparaginic acid, glutamic acid, arginine, lysine, tryptophan, parahydroxyphenylglycine, dihydroxyethylglycine and anthranilic acid; aminosulfonic acids, such as sulfaminic acid and cyclohexylsulfaminic acid; and aminophosphonic acids, such as 1-aminomethylphosphonic acid, 1-dimethylaminoethyl-phosphonic acid, 2-aminoethylphosphonic acid, 2-aminopropylphosphonic acid, 4-aminophenylphosphonic acid, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid and ethylenediaminetetramethylene-phosphonic acid.

Further, the salts formed from acids, such as hydrochloric acid, sulfuric acid, nitric acid, sulfonic acid (e.g., methanesulfonic acid) and oxalic acid, and bases, such as alkali metals, ammonia, lower alkanolamines (e.g., triethanolamine) and lower alkylamines (e.g., triethylamine), can be favorably used.

In addition, water-soluble polymers are also used advantageously. Examples thereof, include polyacrylamide, polyvinyl alcohol, polyvinyl pyrrolidone, polyethyleneimine and mineral acid salts thereof, poly (meth) acrylic acid and metal salts thereof, polystyrenesulfonic acid and metal salts thereof, alkyl(meth)acrylate/2-acrylamide-2-methyl-1-propanesulfonic acid copolymers and metal salts thereof, chlorotrialkylammonium methylstyrene polymers and chlorotrialkylammonium methylstyrene/(meth) acrylic acid copolymers, and polyvinyl phosphonic acid.

Further, soluble starch, carboxymethyl cellulose, dextrin, hydroxyethyl cellulose, gum arabic, guar gum, sodium alginate, gelatin, glucose and sorbitol can be used appropriately, too. These compounds may be used alone or as mixtures of two or more thereof.

In treatment with these compounds, it is appropriate that they be dissolved in water, methyl alcohol or a mixture thereof so as to have a concentration of 0.001 to 10 weight %, preferably 0.01 to 1.0 weight %. As to suitable conditions for the treatment, the treatment temperature is from 25 to 95° C., preferably from 50 to 95° C., the pH of the solution is from 1 to 13, preferably 2 to 10, and the immersion time is from 10 seconds to 20 minutes, preferably 10 seconds to 3 minutes.

When those compounds are used for a subbing layer of the heat-sensitive layer, as is the case with the foregoing immersion treatment, they are dissolved in water, methyl alcohol or a mixture thereof so as to have a concentration of 0.001 to 10 weight %, preferably 0.01 to 1.0 weight %. The pE of the solution prepared is adjusted to the range of 1 to 12 by the use of a basic substance, such as ammonia, triethylamine or potassium hydroxide, or an acidic substance such as hydrochloric acid or phosphoric acid, if needed. To this solution, yellow dyes may further added for the purpose of improving tone reproducibility of the lithographic printing plate precursor to be produced. The suitable dry coverage of such an organic subbing layer is from 2 to 200 mg/$m^2$, preferably from 5 to 100 mg/$m^2$. When the organic subbing layer has its coverage within the foregoing range, satisfactory scum resistance and printing durability can be ensured.

In order to enhance adhesiveness of the substrate to the heat-sensitive layer, an interlayer may be provided. The interlayer which can improve the adhesiveness is generally constituted of diazo resin and a compound capable of adhering to aluminum, such as a phosphoric acid compound. The interlayer may have any thickness so far as uniform bond formation reaction occurs between the interlayer and the heat-sensitive layer provided thereon when these layers are exposed to light. In general, it is appropriate that the interlayer have a dry coverage of about 1 to about 100 mg/$m^2$, preferably 5 to 40 mg/$m^2$. The proportion of a diazo resin in the interlayer is from 30 to 100%, preferably from 60 to 100%.

Prior to the above described treatment or subbing layer formation, the anodized substrate is subjected to washing treatment, and then to the following treatments for the purposes of preventing the anodized layer from dissolving in a developer or a fountain solution, preventing some constituents of the heat-sensitive layer from remaining on the anodized layer improving the strength of the anodized layer , improving the water-receptivity of the anodized layer and improving the adhesiveness of the anodized layer to the heat-sensitive layer.

Examples of such treatments, include a silicate treatment wherein the anodized layer is brought into contact with an aqueous solution of alkali metal silicate. In this treatment, the alkali metal silicate concentration is from 0.1 to 30 weight %, preferably 0.5 to 15 weight %, and the pH of the solution is adjusted to the range of 10 to 13.5 at 25° C. The anodized layer is made to contact with such a solution for 0.5 to 120 seconds at a temperature of 5 to 80° C., preferably 10 to 70° C., particularly preferably 15 to 50° C. In bringing such a solution into contact with the anodized layer, any method may be adopted. For instance, the anodized layer may be immersed in or sprayed with such a solution. When the pH of an aqueous solution of alkali metal silicate is lower than 10, the solution causes gelation; while, when it is higher than 13.5, the anodized layer dissolves in such a solution.

As an alkali metal silicate, sodium silicate, potassium silicate and lithium silicate can be used in the present invention. The hydroxides usable for pH adjustment of the aqueous solution of alkali metal silicate include sodium hydroxide, potassium hydroxide and lithium hydroxide. Additionally, alkaline earth metal salts or group IVb metal salts may be mixed in the foregoing solution. Examples of alkaline earth metal salts which can be mixed therein include water-soluble salts, such as nitrates (e.g., calcium nitrate, strontium nitrate, magnesium nitrate and barium nitrate) sulfates, hydrochlorides, phosphates, acetates, oxalates and borates. Examples of group IVb metal salts which can be mixed therein include titanium tetrachloride, titanium trichloride, potassium titanium fluoride, potassium titanium oxalate, titanium sulfate, titanium tetraiodide and zirconium oxychloride. These alkaline earth metal salts or group IVb metal salts can be used alone or as combinations of two or more thereof. The suitable concentration of these metal salts is from 0.01 to 10 weight %, preferably from 0.05 to 5.0 weight %.

Other examples of the foregoing treatment, include various pore-sealing treatments generally known to be applicable to anodized layers, such as pore sealing with steam, boiling water (hydrothermal solution) or a metal salt (e.g., chromate/dichromate, nickel acetate), pore sealing by impregnation with oils and fats, pore sealing with synthetic resins and pore sealing at low temperatures (by the use of red potassium ferricyanide, or an alkaline earth salts). Of these treatments, pore sealing with steam is comparatively advantageous over the others from the viewpoints of properties as a printing plate substrate (including adhesiveness to the heat-sensitive layer and water receptivity), rapidity, low cost and low pollution. Such pore sealing can be effected using the method disclosed, e.g., in JP-A-4-176690, which comprises continuously or intermittently bringing pressurized or atmospheric steam into contact with the anodized layer under conditions that the relative humidity is at least 70%, the steam temperature is at least 95° C. and the contact time is of the order of 2–180 seconds. As the other method for pore sealing can be adopted a method of immersing the substrate in about 80–100° C. hot water or aqueous alkali solution or spraying the substrate with such hot water or aqueous alkali solution. In this method, a nitrite solution may be used instead of such hot water or aqueous alkali solution, or the immersion or spraying treatment with a nitrite solution may succeed the foregoing treatment. Examples of a nitrite usable therein include nitrites of the group Ia, IIa, IIb, IIIb, IVb, IVa, VIa, VIIa and VIII metals or ammonium (namely ammonium nitrite). As those metal salts, $LiNO_2$, $NaNO_2$, $KNO_2$, $Mg(NO_2)_2$, $Ca(NO_2)_2$, $Zn(NO_2)_2$, $Al(NO_2)_3$, $Zr(NO_2)_4$, $Sn(NO_2)_3$, $Cr(NO_2)_3$, $Co(NO_2)_2$, Mn $(NO_2)_2$ and Ni $(NO_2)_2$ are suitably used. In particular, alkali metal nitrites are used to advantage. These nitrites can be used as a mixture of two or more thereof.

The suitable treatment conditions vary depending on the surface state of the substrate and the kind of alkali metal, so they cannot be generalized. In the case of using sodium nitrite, for instance, the suitable concentration is generally chosen from the range of 0.001 to 10 weight %, preferably 0.01 to 2 weight %,the suitable bath temperature is generally chosen from the range of room temperature to about 100° C., preferably from 60 to 90° C., and the suitable treatment time is generally chosen from the range of 15 to 300 seconds, preferably 10 to 180 seconds. It is appropriate that the pH of the aqueous nitrite solution be adjusted to the range of 8.0 to 11.0, preferably 8.5 to 9.5. The pH adjustment of the aqueous nitrite solution to the foregoing range can be effected by the use of, e.g., alkali buffers. The alkali buffers used therein have no particular restrictions, but aqueous solutions of sodium hydrogen carbonate-sodium hydroxide mixture, sodium carbonate-sodium hydroxide mixture, sodium carbonate-sodium hydrogen carbonate mixture, sodium chloride-sodium hydroxide mixture, hydrochloric acid-sodium carbonate mixture and sodium tetraborate-sodium hydroxide mixture can be used appropriately. In addition, alkali metal salts other than sodium salts, e.g., potassium salts, can also be used for the foregoing alkali buffers.

After performing the silicate treatment or pore-sealing treatment as described above, the treatment with an aqueous acidic solution and the formation of a water-receptive subbing layer as disclosed in JP-A-5-278362 or the formation of an organic layer as disclosed in JP-A-4-282637 or JP-A-7-314937 may be carried out for the purpose of increasing the adhesiveness to the heat-sensitive layer.

As to one characteristic of the substrate for a lithographic printing plate, it is appropriate that the center-line average roughness of the substrate surface be within the range of 0.10 to 1.2 μm. When the center-line average roughness is less than 0.10 μm, the adhesiveness to the heat-sensitive layer is lowered, and a considerable reduction of printing durability is caused; while, when it is greater than 1.2 μm, serious scumming generates during the process of printing. With respect to another characteristic, it is appropriate that the color density of the substrate be within the range of 0.15 to 0.65 in terms of reflection density. When the color density of the substrate is within the foregoing range, satisfactory plate inspection can be achieved without attended by interference with image formation due to strong halation.

On the aluminum substrate in the present printing plate, a water-receptive layer having no solubility in water or a water-receptive layer capable of generating heat under laser exposure and having no solubility in water may be provided directly or via a heat insulation layer comprising an organic polymer.

For instance, a water-receptive layer constituted of fine grains of silica and a hydrophilic resin may be provided on the aluminum substrate. Further, the light-to-heat converting agent as described hereinbefore may be introduced in the water-receptive layer in order to render the water-receptive layer exothermic. By providing such a layer, heat leakage into the aluminum substrate can be made difficult, and besides, the property of generating heat under laser exposure can be imparted to the water-receptive substrate. By further arranging an interlayer made up of an organic polymer between such a water-receptive layer and the aluminum substrate, the heat leakage into the aluminum substrate can be inhibited more effectively. From the viewpoint of on-press developability, it is advantageous that the substrate is non-porous. And it is undesirable for the substrate to have a hydrophilic organic high polymer content of 40% or above, because such a substrate swells in water to suffer deterioration in ink eliminability.

The water-receptive layer used in the present invention has a three-dimensionally cross-linked structure, and does not dissolve in a fountain solution for the water and/or ink-utilized lithography. It is preferable to form such a layer from a colloid as described below. Specifically, the colloid used therein is a sol-gel conversion colloid of oxide or hydroxide of beryllium, magnesium, aluminum, silicon, titanium, boron, germanium, tin, zirconium, iron, vanadium, antimony or a transition metal. In some cases, the colloid used may be a colloid of a composite oxide or hydroxide of two or more of the elements as described above. The metal elements in these colloids form a network structure via oxygen atoms, and besides, they have free hydroxyl groups and alkoxy groups. In other words, bound oxygen atoms and free hydroxyl and alkoxy groups are intermingled in the network structure. At the initial stage of hydrolytic condensation, the colloid is rich in active alkoxy groups and hydroxyl groups, but the colloidal particles becomes large in size and inactive as the reaction proceeds. Therefore, the colloid particle size suitable for the present invention is generally from 2 nm to 500 nm. In the case of silica colloid, spherical particles measuring from 5 nm to 100 nm in size are well suited for use in the present invention. It is also effective that the colloid particles have a feather-like shape measuring 100 nm×10 nm in size as in the case of colloidal aluminum.

In addition, it is also possible to use colloids having a pearl necklace-like shape wherein spherical particles having a size of 10 nm to 50 nm are linked in a length of 50 nm to 400 nm.

Those colloids may be used alone or as mixtures with hydrophilic resins. Thereto, across-linking agent may further be added for the purpose of promoting the cross-linking reaction.

In general, the colloids are stabilized with stabilizers. In the case of positively charged colloids, the stabilizers added are compounds having anionic groups; while they are compound having cationic groups in the case of negatively charged colloids. For instance, the colloidal silicon is charged negatively, so the stabilizers added thereto are amine compounds. And the colloidal aluminum is charged positively, so the stabilizers added thereto are strong acids, such as hydrochloric acid and acetic acid. Most of those colloids form transparent films at room temperature when applied to substrates. However, the films formed after mere evaporation of solvents are in an incompletely gelled state. Therefore, these films are heated up to a temperature enabling the removal of the stabilizers, and tight three-dimensional cross-links are formed therein. The thus prepared films become water-receptive layers well suited for the present invention.

On the other hand, the gelling reaction may be completed in the following manner without using any stabilizers. Specifically, starting materials (e.g., di-, tri- and/or tetra-alkoxysilanes) are made to directly undergo hydrolytic condensation reaction to create an appropriate sol state, coated on a substrate as they are, and then dried to complete the reaction. The temperature at which three-dimensional cross-links can be formed is lower in this case than in the case of using stabilizers.

In the present invention, it is also advantageous to use colloids prepared by dispersing appropriate hydrolytic condensation products in an organic solvent and stabilizing them. By mere evaporation of the solvent, three-dimensionally cross-linked films are formed. Therein, the drying at room temperature becomes possible when the solvent used as dispersion medium is selected from low boiling solvents, such as methanol, ethanol, propanol, butanol, ethylene glycol monomethyl ether, ethylene glycol monoethyl ether and methyl ethyl ketone. In particular, colloids utilizing methanol or ethanol as a dispersing medium are useful in the present invention because they can be cured readily at low temperatures.

Hydrophilic resins suitably used together with the colloids as described above are resins having hydrophilic groups, such as hydroxyl, carboxyl, hydroxyethyl, hydroxypropyl, amino, aminoethyl, aminopropyl and carboxymethyl groups. Examples of such hydrophilic resins include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, hydroxyethyl methacrylate homopolymer and copolymers, hydroxyethyl acrylate homopolymer and copolymers, hydroxypropyl methacrylate homopolymer and copolymers, hydroxypropyl acrylate homopolymer and copolymers, hydroxybutyl methacrylate homopolymer and copolymers, hydroxybutyl acrylate homopolymer and copolymers, polyethylene glycols, hydroxypropylene polymers, polyvinyl alcohols, polyvinyl acetate having a hydrolysis degree of at least 60 weight %, preferably at least 80 weight %, polyvinyl formal, polyvinyl butyral, polyvinyl pyrrolidone, acrylamide homopolymer and copolymers, methacrylamide homopolymer and copolymers, N-methylolacrylamide homopolymer and copolymers, and homopolymer and copolymers of 2-acrylamide-2-methylpropanesulfonic acid or 2-acrylamide-2-methylpropane sulfonate.

Of these hydrophilic resins, polymers having hydroxyl groups of the kind which are not soluble in water, such as hydroxyethyl methacrylate homopolymer and copolymers, and hydroxyethyl acrylate copolymers, are preferable in particular.

These hydrophilic resins are used together with colloids, and it is appropriate that they be added in a proportion of 40 weight % or less when they are soluble in water, or 20 weight % or less when they are insoluble in water, to the total solid contents of the water-receptive layer.

Those hydrophilic resins may be used as they are, but cross-linking agents for hydrophilic resin other than colloids may be added with the intention of enhancing the impression capacity. Examples of a cross-linking agent suitable for the hydrophilic resins include formaldehyde, glyoxal, polyisocyanate and initial hydrolytic condensation products of tetraalkoxysilanes, dimethylolurea and hexamethylolmelanine.

In addition to the oxide or hydroxide colloids and the hydrophilic resins as described above, cross-linking agents for promoting cross-linkage in the colloids may be added to the present water-receptive layer. Suitable examples of such cross-linking agents include initial hydrolytic condensation products of tetraalkoxysilanes, trialkoxysilylpropyl-N,N,N-trialkylammonium halides and aminopropyltrialkoxysilanes. It is appropriate that these cross-linking agents be added in a proportion of 5 weight % or less to the total solid contents in the water-receptive layer.

To the present water-receptive layer, a hydrophilic light-to-heat converting agent may further be added for the purpose of enhancing the thermal sensitivity. The light-to-heat converting agents especially suitable for this purpose are water-soluble infrared absorbing dyes, specifically cyanine dyes having sulfonic acid groups, alkali metal sulfonate groups or amine groups. These dyes can be added in a proportion of 1 to 20 weight %, preferably 5 to 15 weight %, to the total weight of the water-receptive layer.

The suitable dry thickness of the present three-dimensionally cross-linked water-receptive layer is from 0.1 to 10 $\mu$m, preferably from 0.5 to 5 $\mu$m. When the water-receptive layer is too thin, it is inferior in durability and cannot ensure satisfactory impression capacity; while, when it is too thick, the printing plate prepared suffers deterioration in resolution.

When the foregoing interlayer or water-insoluble water-receptive layer is a layer adjacent to the heat-sensitive layer, it can contain a precursor compound capable of acting as a co-reactant of the compound having thermally reactive groups which is encapsulated in microcapsules constituting the heat-sensitive layer.

As organic polymers used for the interlayer provided between the water-receptive layer and the aluminum substrate, any of generally used organic polymers, such as polyurethane resin, polyester resin, acrylic resin, cresol resin, resol resin, polyvinyl acetal resin and vinyl resin, can be used without any problems. The suitable coverage of such organic polymers is from 0.1 $g/m^2$ to 5.0 $g/m^2$. When the coverage is lower than 0.1 $g/m^2$, the heat insulating effect of the interlayer is small; while, when the coverage is higher than 5.0 $g/m^2$, the printing durability in non-image areas is lowered.

Images can be formed in the present lithographic printing plate precursor by exposure to high-output laser beams. In addition, writing machines, such as a thermal head, may be used for image formation. In the present invention, it is preferable to use lasers emitting light in the infrared or near infrared region. In particular, laser diode emitting light in the near infrared region is used to advantage. In this case, the energy applied by exposure is required to be large enough to rupture the outer wall of the microcapsules.

Although it is also possible to record images by means of an ultraviolet lamp, it is preferable in the present invention to perform imagewise exposure by means of a solid or semiconductor laser emitting infrared radiation of wavelengths ranging from 760 nm to 1,2000 nm. The suitable laser output is at least 100 mW, and the use of a multi-beam laser is effective in reducing the exposure time. And the suitable exposure time per one pixel is within 20 microseconds. Further, it is appropriate that the energy applied to the recording material by laser exposure be from 10 to 300 $mJ/cm^2$.

The printing plate thus exposed is mounted on the cylinder of a printing machine without undergoing any processing. The printing can be performed using the thus mounted plate and following the process as described below.

Specifically, the processes usable herein are:

(1) a process in which a fountain solution is fed to a printing plate mounted in the printing machine to effect development, and then printing is initiated by feeding ink to the plate, (2) a process in which a fountain solution and ink are fed to a printing plate mounted in the printing machine, thereby developing the plate, and then printing is initiated, and (3) a process wherein ink is fed to the plate, and then a fountain solution and a paper sheet are fed at the same time to start printing.

Further, the printing plate precursor according to the present invention can be made into a printing plate in a process as described in Japanese Patent 2,938,398, wherein the printing plate precursor is mounted on the cylinder of a printing machine, exposed by means of a laser installed in the printing machine, and then developed on the machine by feeding thereto a fountain solution and/or ink. And it is preferable for the present printing plate precursor to be developable with water or an aqueous solution or make it possible to be mounted on a printing machine without development and subjected to printing.

EXAMPLES

Now, the present invention will be illustrated in more detail by reference to the following examples. However, the present invention should not be construed as being limited to these examples.

Preparation Example of Support (1)

The forging of JIS A1050 alloy containing 99.5% of Al, 0.30% of Fe, 0.10% of Si, 0.02% of Ti and 0.013% of Cu was subjected to cleaning treatment, and then cast. In the cleaning treatment, for removing unnecessary gases, such as hydrogen gas, in the forging were removed by degassing treatment, and the degassed forging was passed through a ceramic tube filter. For casting, a DC casting method was adopted. The ingot as a solidified plate having a thickness of 500 mm was planed off to cut away its surface part (i.e., subjected to scalping) in a thickness of 10 mm, and then heated for 10 hours at 550° C. for homogenization so as not to coarsen intermetallic compounds. Next, the thus treated ingot was subjected to hot rolling at 400° C., annealed for 60 seconds at 500° C. in a continuous annealing furnace, and then subjected to cold rolling. Thus, an aluminum rolled plate having a thickness of 0.30 mm was formed. By controlling the surface roughness of the pressure rolls, the center-line average surface roughness Ra of the aluminum plate after cold rolling was adjusted to 0.2 $\mu$m. Thereafter, the aluminum plate was treated with a tension leveler to improve the planarity thereof.

In the next place, the rolled plate was converted into a substrate for a lithographic printing plate by the following surface treatment.

In order to remove the rolling oil from the aluminum plate surface, the aluminum plate was degreased at 50° C. for 30 seconds by the use of a 10% aqueous solution of sodium aluminate, and then neutralized and desmutted at 50° C. for 30 seconds by the use of a 30% aqueous solution of sulfuric acid.

For the purpose of improving adhesiveness of the substrate to a heat-sensitive layer and imparting water retentivity to non-image areas, the aluminum plate surface was further subjected to the so-called graining treatment. Specifically, an aqueous solution containing 1% of nitric acid and 0.5% of aluminum nitrate was kept at 45° C. While drifting the aluminum web in the aqueous solution, electrolytic graining was carried out by applying thereto the electricity having an electrical quantity of 240 Coulomb/$dm^2$ at the anode, an alternating wave form having a duty factor of 1:1 and a current density of 20 A/$dm^2$ by means of an indirect feed cell. Thereafter, the grained aluminum web was etched using a 10% aqueous solution of sodium aluminate for 30 seconds at 50° C., and then neutralized and desmutted at 50° C. for 30 seconds by the use of a 30% aqueous solution of sulfuric acid.

Furthermore, the substrate was provided with an anodized layer by anodic oxidation for the purpose of improving abrasion resistance, chemical resistance and water retentivity. Specifically, a 20% aqueous solution of sulfuric acid was kept at 35° C. and used as an electrolytic solution. While the aluminum web was made to travel through this electrolytic solution, an electric current of 14 A/$dm^2$ was passed therethrough by means of an indirect feed cell to effect electrolysis. Thus, an anodized layer of 2.5 g/$m^2$ was formed.

Thereafter, silicate treatment was carried out in order to ensure water receptivity in non-image areas of a printing plate to be produced. In the treatment, a 1.5% aqueous solution of disodium trisilicate ($Na_2O.3SiO_2$) was kept at 70° C., and the aluminum web was made to travel through the solution so that the time for contact with the aluminum web was adjusted to 15 seconds, and then washed. The amount of Si adhered to the aluminum web was 10 mg/$m^2$. The thus prepared Substrate (1) had a center-line average surface roughness Ra of 0.25 $\mu$m.

Preparation Example of Support (2)

Aluminum substrate provided with water-receptive layer:

In 240 g of methanol were dissolved 45.2 g of methanol silica sol (a colloid made up of a methanol solution containing 30 weight % of silica particles measuring 10 to 20 nm in size, produced by Nissan Chemicals Industries Ltd.), 1.52 g of poly (2-hydroxyethyl methacrylate) and 3.2 g of a light-to-heat converting agent (Dye IR-11 illustrated in this specification). This solution was bar-coated on Substrate (1) prepared above, and dried for 30 seconds in a 100° C. oven. Thus, Substrate (2) having an exothermic water-receptive layer having a dry coverage of 1.0 g/m was prepared.

Preparation Example of Support (3)

Substrate having heat insulation layer and water-receptive layer:

In a mixture of 100 g of methyl ethyl ketone and 90 g of methyl lactate was dissolved 10 g of polyvinyl butyral resin. This solution was bar-coated on Substrate (1) prepared above, and dried for 60 seconds in a 100° C. oven. Thus, a heat insulation layer having a dry coverage of 0.5 g/$m^2$ was formed.

Further, 45.2 g of methanol silica sol, 1.52 g of poly (2-hydroxyethyl methacrylate) and 3.2 g of a light-to-heat converting agent (Dye IR-11 illustrated in this specification) were dissolved in 240 g of methanol. This solution was bar-coated on the heat insulation layer prepared above, and dried for 30 seconds in a 100° C. oven. Thus, Substrate (3) having an exothermic water-receptive layer having a dry coverage of 1.0 g/$m^2$ was prepared.

Synthesis Example of Microcapsules (1)

An oil-phase component was prepared by dissolving 30 g of adduct of trimethylolpropane and xylylene diisocyanate (D-110N, trade name, a product of Takeda Yakuhin Kogyo K.K.). 30 g of Epikote 1001 (trade name, a product of Yuka Shell Epoxy Co., Ltd.), 8 g of a light-to-heat converting agent (Dye IR-26 illustrated in this specification) and 0.5 g of an anionic surfactant (Pionin A41C. trade name, a product of Takemoto Yushi) in 90 g of ethyl acetate. As a water-phase component, 180 g of a 4% aqueous solution of polyvinyl alcohol, PVA 205 (trade name, a product of Kuraray Co., Ltd.) was prepared. An emulsion was made by emulsifying the foregoing oil-phase and water-phase components by means of a homogenizer rotating at 10,000 r.p.m. The emulsion thus made was admixed with 120 g of water, stirred for 30 minutes at room temperature, and further stirred for 3 hours at 40° C. The thus prepared microcapsule solution had a solids concentration of 18% and an average microcapsule size of 0.6 $\mu$m.

Synthesis Example of Microcapsules (2)

An aqueous dispersion of microcapsules was synthesized in the same manner as in the synthesis of Microcapsules (1), except that hydroquinonebis (2-hydroxyethyl) ether was used in place of Epikote 1001.

Synthesis Example of Microcapsules (3)

An oil-phase component was prepared by dissolving 20 g of xylylene diisocyanate, 5 g of Epikote 1001, 1 g of hydroquinonebis (ditrimethylsiloxyethyl) ether, 5 g of a light-to-heat converting agent (Dye IR-26 illustrated in this specification) and 0.33 g of Pionin A41C (produced by Takemoto Yushi) in 80 g of ethyl acetate. As a water-phase component, 120 g of a 4% aqueous solution of polyvinyl alcohol PVA 205 was prepared. An emulsion was made by emulsifying the foregoing oil-phase and water-phase components by means of a homogenizer rotating at 10,000 r.p.m. The emulsion thus made was admixed with 80 g of water, stirred for 30 minutes at room temperature, and further stirred for 3 hours at 40° C. The thus prepared microcapsule solution had a solid contents of 20% and an average microcapsule size of 0.8 $\mu$m.

Synthesis Example of Microcapsules (4)

An oil-phase component was prepared by dissolving 20 g of D-110N (produced by Takeda Yakuhin Kogyo K.K.), 6 g of phenol-blocked tolylene diisocyanate and 0.33 g of Pionin A41C (produced by Takemoto Yushi) in 80 g of ethyl acetate. As a water-phase component, 120 g of a 4% aqueous solution of polyvinyl alcohol PVA 205 was prepared. An emulsion was made by emulsifying the foregoing oil-phase and water-phase components by means of a homogenizer rotating at 10,000 r.p.m. The emulsion thus made was admixed with 80 g of water, stirred for 30 minutes at room temperature, and further stirred for 3 hours at 40° C. The thus prepared microcapsule solution had a solid contents of 20% and an average microcapsule size of 0.5 μm.

Synthesis Example of Microcapsules (5)

An oil-phase component was prepared by dissolving 20 g of xylylene diisocyanate, 5 g of phenol-blocked tolylene diisocyanate, 1 g of ditrimethylsiloxybutane, 5 g of a light-to-heat converting agent (Dye IR-27 illustrated in this specification) and 0.33 g of Pionine A41C in 80 g of ethyl acetate. As a water-phase component, 120 g of a 4% aqueous solution of polyvinyl alcohol PVA 205 was prepared. An emulsion was made by emulsifying the foregoing oil-phase and water-phase components by means of a homogenizer rotating at 10,000 r.p.m. The emulsion thus made was admixed with 80 g of water, stirred for 30 minutes at room temperature, and further stirred for 3 hours at 40° C. The thus prepared microcapsule solution had a solid contents of 20% and an average microcapsule size of 0.8 μm.

Preparation of Aqueous Dispersion of Amine Precursor

A 25% aqueous dispersion of amine precursor was prepared from 3 g of 4-(phenylsulfonyl)phenylsulfonylacetate of bisguanidine compound (illustrated below as AZ-1), 1.0 g of a 4% aqueous solution of PVA 205 and 8.2 g of purified water by means of a glass beads paint shaker.

AZ-1

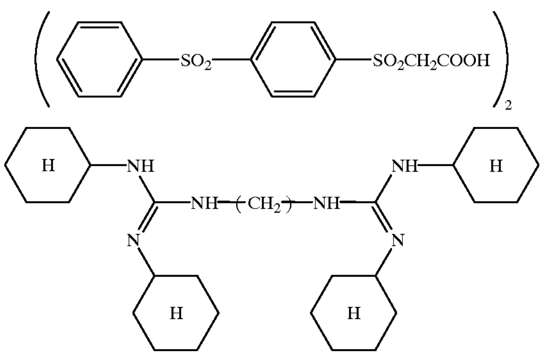

Example 1

The following coating composition (T1) for a heat-sensitive layer was bar-coated on Substrate (1), and then dried for 120 seconds in a 70° C. oven, thereby producing a lithographic printing plate precursor provided with the heat-sensitive layer having a dry coverage of 1 g/m$^2$.

Coating Composition (T1) for Heat-sensitive Layer

| | |
|---|---|
| Water | 70 g |
| 1-Methoxy-2-propanol | 30 g |
| Microcapsules (1) | 5 g |
| Microcapsules (2) | 5 g |
| Polyhydroxyethyl acrylate (weight average molecular weight: 25,000) | 0.5 g |
| p-Diazodiphenylamine sulfate | 0.2 g |

The thus prepared lithographic printing plate precursor was exposed by means of a Trendsetter 3244VFS (trade name, made by CREO CO.) equipped with a 40W water-cooled infrared semiconductor laser under conditions that the output of the laser was 9W, the external drum revolving speed was 105 r.p.m., the energy applied to the plate surface was 200 mJ/cm$^2$ and the resolution was 2400 dpi., and then mounted on the cylinder of a printer SOR-M (made by Heidelberg A.G.) without any further processing. And a fountain solution and ink were fed successively to the plate surface, thereby starting the printing. Therein, on-press development of the printing plate precursor was achieved without any troubles, and 10,000 sheets of good-quality printed matter were obtained. In addition, after keeping it for 5 days under a temperature of 60° C., the printing plate precursor was subjected to the same printing operations as described above. Therein, no scumming generated, too. This result shows that the present plate precursor had satisfactory keeping stability.

Comparative Example 1

A lithographic printing plate precursor for comparison was produced in the same manner as in Example 1, except that the following coating composition (t1) was used in place of the coating composition (T1). The thus produced printing plate precursor was exposed and subjected to printing operations in the same manners as in Example 1, and thereby 10,000 sheets of good-quality printed matter were obtained. However, the printing plate precursor aged by the storage for 5 days under a temperature of 60° C. suffered deterioration in on-press developability, and caused scumming in the process of printing.

Coating Composition (t1) for Comparative Heat-sensitive Layer

| | |
|---|---|
| Water | 70 g |
| 1-Methoxy-2-propanol | 30 g |
| Microcapsules (1) | 5 g |
| Hydroquinonebis (2-hydroxyethyl) ether | 1 g |
| Polyhydroxyethyl acrylate (weight average molecular weight: 25,000) | 0.5 g |
| p-Diazodiphenylamine sulfate | 0.2 g |

Examples 2 and 3

Lithographic printing plate precursors were produced in the same manner as in Example 1, except that Support (1) used in Example 1 was replaced by Support (2) in Example 2 and Support (3) in Example 3. The thus produced printing plate precursors were each exposed and subjected to printing operations in the same manners as in Example 1. As a result, the number of good-quality printed sheets was 20,000 in Example 2 and 25,000 in Example 3. In addition, the printing plate precursors aged by the storage for 5 days under a temperature of 60° C. were each examined for on-press developability. As a result, it was confirmed that both printing plate precursors had good on-press developability and generated no scumming in the process of printing, too.

Example 4

The following coating composition (T2) for a heat-sensitive layer was bar-coated on Substrate (1), and then dried for 120 seconds in a 70° C. oven. Further, the following coating composition (OC-1) for an overcoat layer was coated on the heat-sensitive layer at a dry coverage of 0.5 g/$m^2$.

Coating Composition (T2) for Heat-sensitive Layer

| | |
|---|---|
| Water | 70 g |
| 1-Methoxy-2-propanol | 30 g |
| Microcapsules (1) | 5 g |
| Polyhydroxyethyl acrylate | 0.5 g |
| (weight average molecular weight: 25,000) | |
| Coating Composition (OPC-1) for Overcoat Layer: | |
| Water | 100 g |
| Gum arabic | 6.85 g |
| Microcapsules (2) | 3 g |

The thus produced printing plate precursor was exposed and subjected to printing operations in the same manners as in Example 1. Therein, it showed satisfactory on-press developability, and provided 30,000 sheets of good-quality printed matter. In addition, even when the printing plate precursor was aged under the same condition as in Example 1 prior to the printing operations, the printing plate made therefrom generated no scamming in the process of printing.

Examples 5 to 11 and Comparative Examples 2 to 5

In accordance with the combinations shown in Table 1, the following various coating compositions for heat-sensitive layers were bar-coated on substrates respectively so as to have a dry coverage of 1 g/$m^2$, and then dried for 120 seconds in a 70° C. oven, thereby producing lithographic printing plate precursors. In analogy with these plate precursors according to the present invention, lithographic printing plate precursors for comparison were produced according to the combinations shown in Table 2.

TABLE 1

Supports and Coating Compositions for Heat-sensitive Layers used in Examples 5 to 11

| Example | 5 | 6 | 7 | 8 | 9 | 10 | 11 |
|---|---|---|---|---|---|---|---|
| Support | (1) | (1) | (1) | (1) | (1) | (2) | (3) |
| Coating composition for Heat-sensitive layer | (T3) | (T4) | (T5) | (T6) | (T7) | (T3) | (T3) |

TABLE 2

Supports and Coating Compositions for Heat-sensitive Layers used in Comparative Examples 2 to 5

| Comparative Example | 2 | 3 | 4 | 5 |
|---|---|---|---|---|
| Support | (1) | (1) | (1) | (1) |
| Coating composition for Heat-sensitive layer | (t2) | (t1) | (t3) | (t4) |

| | |
|---|---|
| Coating Composition (T3) for Heat-sensitive Layer: | |
| Water | 70 g |
| 1-Methoxy-2-propanol | 30 g |
| Microcapsules (1) | 5 g |
| Polyhydroxyethyl acrylate | 0.5 g |
| Dispersion of amine precursor | 3 g |
| Coating Composition (T4) for Heat-sensitive Layer: | |
| Water | 70 g |
| 1-Methoxy-2-propanol | 30 g |
| Microcapsules (3) | 5 g |
| Polyhydroxyethyl acrylate | 0.5 g |
| p-Diazodiphenylamine sulfate | 1 g |
| Coating Composition (T5) for Heat-sensitive Layer: | |
| Water | 70 g |
| 1-Methoxy-2-propanol | 30 g |
| Microcapsules (4) | 5 g |
| Microcapsules (2) | 5 g |
| Polyhydroxyethyl acrylate | 0.5 g |
| p-Diazodiphenylamine sulfate | 0.2 g |
| Coating Composition (T6) for Heat-sensitive Layer: | |
| Water | 70 g |
| 1-Methoxy-2-propanol | 30 g |
| Microcapsules (4) | 3 g |
| Dispersion of amine precursor | 3 g |
| Light-to-heat converting agent (IR-10) | 0.3 g |
| Coating Composition (T7) for Heat-sensitive Layer: | |
| Water | 70 g |
| 1-Methoxy-2-propanol | 30 g |
| Microcapsules (5) | 6 g |
| Light-to-heat converting agent (IR-10) | 0.3 g |
| Coating Composition (t2) for Comparative Heat-sensitive Layer: | |
| Water | 70 g |
| 1-Methoxy-2-propanol | 30 g |
| Microcapsules (1) | 5 g |
| Polyhydroxyethyl acrylate | 0.5 g |
| Diethylenetriamine | 1 g |
| Coating Composition (t3) for Comparative Heat-sensitive Layer: | |
| Water | 70 g |
| 1-Methoxy-2-propanol | 30 g |
| Microcapsules (4) | 5 g |
| Polyhydroxyethyl acrylate | 0.5 g |
| Diethylenetriamine | 1 g |
| Light-to-heat converting agent (IR-10) | 0.3 g |
| Coating Composition (t4) for Comparative Heat-sensitive Layer: | |
| Water | 70 g |
| 1-Methoxy-2-propanol | 30 g |
| Microcapsules (4) | 5 g |
| Polyhydroxyethyl acrylate | 0.5 g |
| Hydroquinonebis (2-hydroxyethyl) ether | 1 g |
| p-Diazodiphenylamine sulfate | 0.2 g |
| Light-to-heat converting agent (IR-10) | 0.3 g |

In the same manner as in Example 1, each of the thus produced lithographic printing plate precursors according to the present invention and those for comparison was subjected to exposure and then to printing operations without processing. Therein, on-press development and printing were possible for all plate precursors including comparative ones without any problems as far as these procedures were done just after the production of plate precursors. The impression capacity expressed in terms of the number of sheets clearly printed from each printing plate is set forth in Table 3. Further in Table 3 is shown whether or not the scumming generated upon printing from the printing plate precursors having undergone the exposure and treatments for printing after they were aged by the storage for 5 days at 60° C.

TABLE 3

| | Co-reactant | Impression capacity (number of clearly printed sheets) | Scumming upon printing from stored plate precursor |
|---|---|---|---|
| Example 5 | Amine precursor | 20,000 | No scumming generated |
| Example 6 | Alcohol precursor | 15,000 | No scumming generated |
| Example 7 | Isocyanate precursor | 20,000 | No scumming generated |
| Example 8 | Amine precursor | 20,000 | No scumming generated |
| Example 9 | Alcohol precursor and isocyanate precursor | 20,000 | No scumming generated |
| Example 10 | Amine precursor | 25,000 | No scumming generated |
| Example 11 | Amine precursor | 40,000 | No scumming generated |
| Comparative Example 2 | Amine | 10,000 | Scumming generated |
| Comparative Example 3 | Alcohol | 10,000 | Scumming generated |
| Comparative Example 4 | Amine | 10,000 | Scumming generated |
| Comparative Example 5 | Alcohol | 10,000 | Scumming generated |

Example 12

The following coating composition (T8) for a heat-sensitive layer was bar-coated on Substrate (1), and then dried for 120 seconds in an 70° C. oven, thereby forming a heat-sensitive layer having a dry coverage of 1 g/$m^2$. On this heat-sensitive layer, the following coating composition (OC-2) for an overcoat layer was further coated so as to have a dry coverage of 0. 5 g/$m^2$ to produce a lithographic printing plate precursor.

| | |
|---|---|
| Coating Composition (T8) for Heat-sensitive Layer: | |
| Water | 70 g |
| 1-Methoxy-2-propanol | 30 g |
| Microcapsules (1) | 5 g |
| Polyhydroxyethyl acrylate | 0.5 g |
| Coating Composition (OPC-2) for Overcoat Layer: | |
| Water | 70 g |
| Gum arabic | 2 g |
| Dispersion of amine precursor | 6 g |
| Light-to-heat converting agent (IR-10) | 0.1 g |

The thus produced lithographic printing plate precursor was subjected to exposure and printing operations in the same manner as in Example 1. As a result, 15,000 sheets of scum-free printed matter of good quality were obtained. And even in the case of aging the printing plate precursor by the storage for 5 days at 60° C., no scumming generated upon printing.

Advantages of the Invention

Lithographic printing plate precursors according to the present invention can be made into printing plates by scanning exposure based on digital signals, have satisfactory on-press developability and ensure high impression capacity. Moreover, they have excellent storage stability.

While the invention has been described in detail and with reference to specific embodiment thereof, it will be apparent to one skilled in the art various changes and modification can be made therein without departing from the sprit and scope thereof.

What is claimed is:

1. A lithographic printing plate precursor having a heat-sensitive layer on a water-receptive substrate, said heat-sensitive layer comprising microcapsules containing a compound having a thermally reactive functional group, and said printing plate precursor further containing in said heat-sensitive layer or a layer adjacent to said heat-sensitive layer a compound capable of acting as a co-reactant in thermal reaction with said compound having a thermally reactive functional group in a state contained in other microcapsules.

2. The lithographic printing plate precursor as in claim 1, wherein the heat-to-sensitive layer or a layer adjacent to the heat-sensitive layer further comprises a light-to-heat converting agent.

3. A lithographic printing plate precursor having a heat-sensitive layer on a water-receptive substrate, said heat-sensitive layer comprising microcapsules containing a compound having a thermally reactive functional group, and said printing plate precursor further containing in said heat-sensitive layer or a layer adjacent to said heat-sensitive layer a precursor compound having a reactive functional group which is an amino group, a carboxyl group or a hydroxyl group in a protected condition which can exhibit its reactivity upon heating and act as a co-reactant in thermal reaction with said compound having a thermally reactive functional group.

4. The lithographic printing plate precursor as in claim 3, wherein the precursor compound and the compound having a thermally reactive functional group are contained in the same or different microcapsules.

5. The lithographic printing plate precursor as in claim 3, wherein the precursor compound is a precursor of an amine compound.

6. The lithographic printing plate precursor as in claim 5, wherein the precursor of an amine compound is an arylsulfonylacetate of an amine compound.

7. The lithographic printing plate precursor as in claim 3, wherein the heat-sensitive layer or a layer adjacent to the heat-sensitive layer further comprises a light-to-heat converting agent.

8. The lithographic printing plate precursor as in claim 3, wherein the precursor compound having a reactive functional group in a protected condition is a compound containing carboxylic group protected by ester formation using tetrahydropyranyl groups, t-butyl groups, t-butyldimethylsilyl groups, N-phthalimidomethyl groups or cinnamyl groups.

9. The lithographic printing plate precursor as in claim 3, wherein the precursor compound having a reactive functional group in a protected condition is a compound containing hydroxyl groups etherified by trimethylsilyl groups, triisopropylsilyl groups or tetrahydropyranyl groups.

10. A lithographic printing plate precursor having a heat-sensitive layer on a water-receptive substrate, said heat-sensitive layer comprising microcapsules containing a compound having a thermally reactive functional group, and said printing plate precursor further containing in said heat-sensitive layer or a layer adjacent to said heat-sensitive layer a precursor compound having a reactive functional group in a protected condition which can exhibit its reactivity upon heating and act as a co-reactant in thermal reaction of said compound having a thermally reactive functional group wherein the precursor compound and the compound having a thermally reactive functional group are contained in the same or different microcapsules.

11. A lithographic printing plate precursor having a heat-sensitive layer on a water-receptive substrate, said heat-sensitive layer comprising microcapsules containing a compound having a thermally reactive functional group, and said printing plate precursor further containing in said heat-sensitive layer or a layer adjacent to said heat-sensitive layer a precursor compound having a reactive functional group in a protected condition which can exhibit its reactivity upon heating and act as a co-reactant in thermal reaction said compound having a thermally reactive functional group wherein the precursor compound is an arylsulfonylacetate of an amine compound.

* * * * *